(12) United States Patent
Narita et al.

(10) Patent No.: US 6,568,580 B2
(45) Date of Patent: May 27, 2003

(54) BUMP BONDING APPARATUS AND METHOD

(75) Inventors: Shoriki Narita, Hirakata (JP); Makoto Imanishi, Neyagawa (JP); Takaharu Mae, Hirakata (JP); Shinji Kanayama, Kashihara (JP); Nobuhisa Watanabe, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/911,802

(22) Filed: Jul. 25, 2001

(65) Prior Publication Data

US 2001/0042772 A1 Nov. 22, 2001

Related U.S. Application Data

(62) Division of application No. 09/335,779, filed on Jun. 18, 1999, now Pat. No. 6,302,317.

(30) Foreign Application Priority Data

Jun. 19, 1998 (JP) .......................................... 10-173100

(51) Int. Cl.[7] .............................................. B23K 37/04
(52) U.S. Cl. ........................................ 228/41; 228/49.5
(58) Field of Search ........................ 29/56, 56.22, 740; 438/613; 257/737, 738; 228/41, 47, 49.5

(56) References Cited

U.S. PATENT DOCUMENTS

| | | | |
|---|---|---|---|
| 3,887,998 A | 6/1975 | Hartleroad et al. ........... 29/589 |
| 3,960,279 A | * | 6/1976 | Hartleroad et al. |
| 3,972,424 A | 8/1976 | Levy et al. .................... 214/1 |
| 4,087,924 A | 5/1978 | Fujimoro et al. |
| 4,425,075 A | 1/1984 | Quinn ........................ 414/755 |
| 4,441,853 A | 4/1984 | Kosugi |
| 4,518,848 A | 5/1985 | Weber ........................ 219/388 |
| 4,556,317 A | 12/1985 | Sandland et al. ........... 356/237 |
| 5,031,821 A | 7/1991 | Kaneda et al. ............. 228/110 |
| 5,059,559 A | 10/1991 | Takahashi et al. |
| 5,277,539 A | 1/1994 | Matsui et al. ............... 414/735 |
| 5,278,494 A | 1/1994 | Obigane ..................... 324/158 |
| 5,294,038 A | 3/1994 | Nakano |
| 5,550,540 A | 8/1996 | Furlan et al. .................. 27/82 |
| 5,617,209 A | 4/1997 | Svetkoff et al. |
| 5,675,856 A | 10/1997 | Itzkowitz ....................... 15/77 |
| 5,711,647 A | * | 1/1998 | Slocum |
| 5,733,024 A | * | 3/1998 | Slocum et al. |
| 5,864,944 A | 2/1999 | Kashiwagi et al. ........... 29/833 |

FOREIGN PATENT DOCUMENTS

| | | |
|---|---|---|
| JP | 401230240 | 9/1989 |
| JP | 403006842 | 1/1991 |
| JP | 5-161208 | 6/1993 |

* cited by examiner

Primary Examiner—Tom Dunn
Assistant Examiner—Jonathan Johnson
(74) Attorney, Agent, or Firm—Wenderoth, Lind & Ponack, L.L.P.

(57) ABSTRACT

Wafers are previously positioned so that the wafer orientation flat is oriented in a particular direction. A transporting means then moves and places the previously positioned wafer on a bonding stage where bumps are formed on the wafer by means of a bonding head. The transporting means has a sensor for detecting the position of the orientation flat of a wafer on the bonding stage from a position above the bonding stage, thereby avoiding the adverse effects of heat from the bonding stage during orientation flat detection.

2 Claims, 30 Drawing Sheets

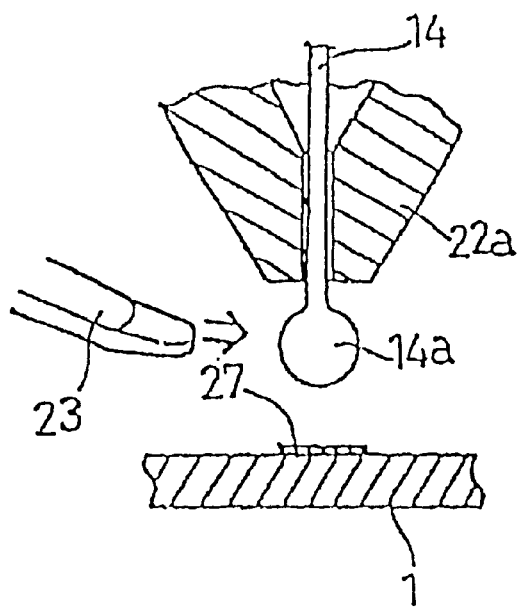
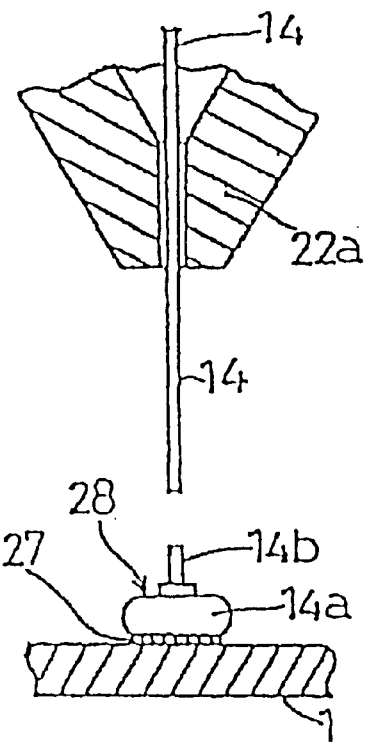
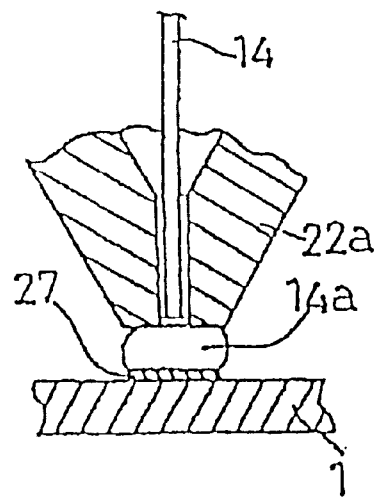

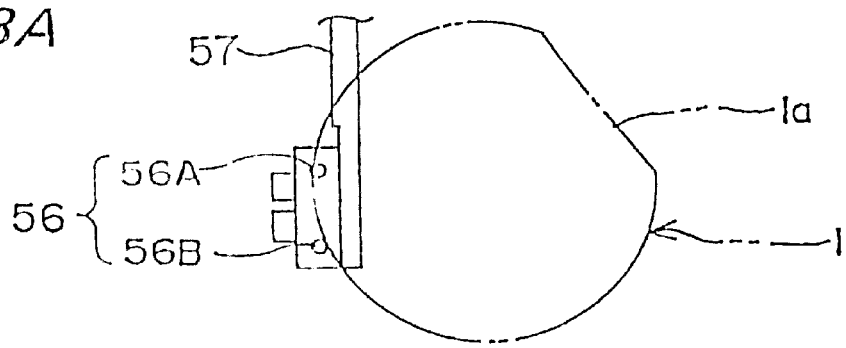
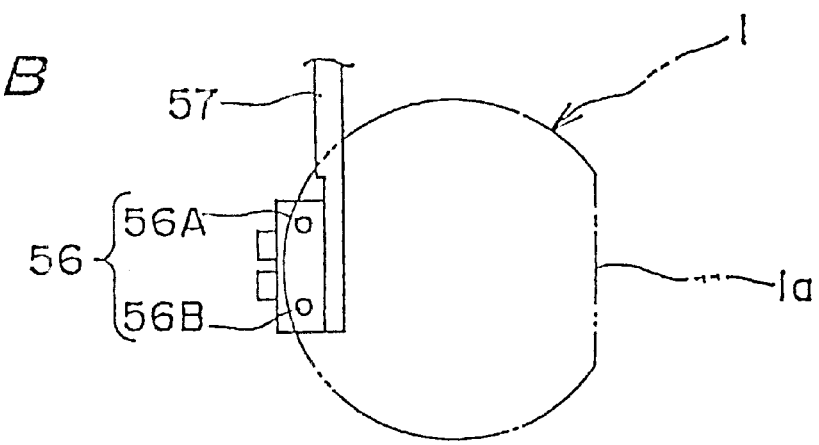
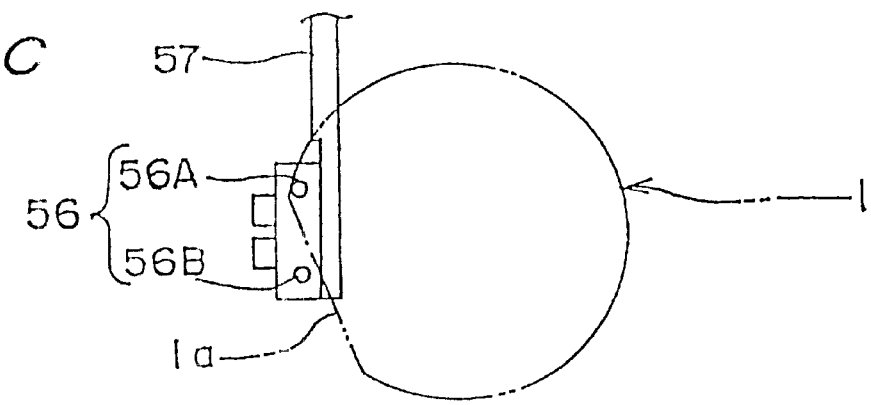
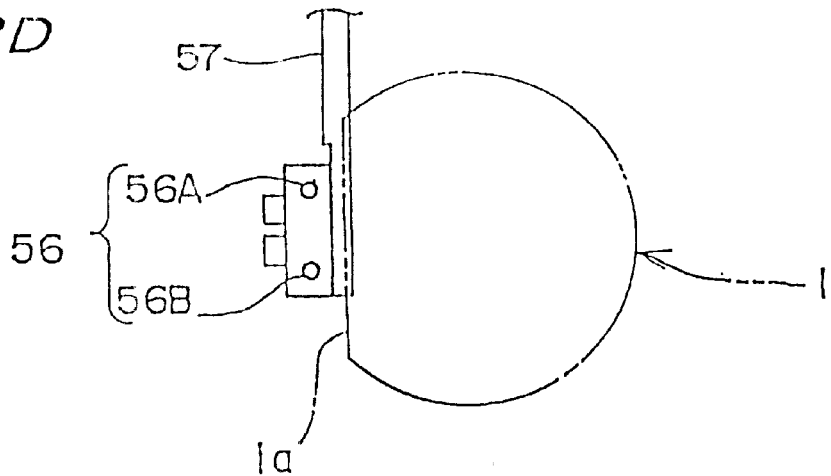

BUMP BONDING APPARATUS AND METHOD

This application is a Divisional application of application Ser. No. 09/335,779, filed Jun. 18, 1999 now U.S. Pat. No. 6,302,317.

BACKGROUND OF THE INVENTION

1. Field of the Invention

The present invention relates to a bump bonding apparatus for forming, by means of a wire bonding technique, bumps for establishing an electrical connection to an electrode part of an IC chip. More specifically, the present invention relates to a bump bonding apparatus and method for forming such bumps on the wafer before being cut into IC chips.

2. Description of Related Art

Demand for smaller and lighter electronic devices has accelerated in recent years, particularly with respect to portable devices, and this has significantly increased demand for smaller IC chips for use in these electronic devices.

Conventionally, in a bump bonding apparatus, a single wafer is diced into a plurality of individual IC chips, and each IC chip is transported and positioned onto the bonding stage for bonding by ones, to form bumps at the electrode parts on the IC chip. Such bump bonding apparatuses, however, suffer from numerous technical problems, including: low production efficiency; difficulty in moving and handling the IC chips with a tray; and difficulty in positioning the IC chips with good precision.

Some of these problems can be addressed by forming bumps for individual IC chips before dicing the wafers into individual chips.

As described more fully below, however, forming bumps directly onto the undiced wafer presents a different set of technical difficulties as compared with handling the individual IC chips, and these problems must therefore be resolved in practice.

For example, while the wafers supplied to the bump bonding apparatus are stacked on multiple shelves in the wafer carrier, the wafers are loose in the carrier. Therefore, after the wafers are extracted from the carrier and regulated for their position on the positioning table, these wafers are moved to the bonding stage. The wafers are circular discs having a straight orientation flat cut into one edge of the wafer. On the positioning table, it is necessary to regulate a center of the wafer in position and regulate the circumferential location of the orientation flat. This requires a complex mechanism, such as a turntable and means for positioning the wafer from four directions around the wafer circumference. Positioning is also time consuming. Because the wafers are loose in the carrier, there is also the further danger of carrier vibration causing a wafer to fall out from its storage location.

When bumps are formed at various points around the entire surface of the stationary wafer with a large area, the relative movement distance of the bonding head and bonding stage becomes rather long. Therefore, a longer arm is required for the bonding mechanism. This makes it mechanically difficult to assure sufficient positioning precision. These problems can be addressed by dividing the wafer circumferentially into a plurality of segments for bump formation, turning the wafer about its center when all bumps in one segment are formed, positioning the next segment for bump formation, and then forming the bumps in that segment.

In such a case, if the bonding stage, on which the wafer is fixed, is turned, it heats up the stage. Thus, thermal expansion and contraction of the turn drive mechanism makes consistent, high precision positioning difficult. This heat problem can be addressed in part by blowing a turn air flow to the bottom of the wafer to float and turn the wafer, and stopping the turn of the wafer based either on a timer or visual inspection by an operator. A problem with this method, however, is that minute variations in the turning air flow cause the wafer to move irregularly, easily producing variations in rotational positioning. Therefore, consistent, stable wafer positioning is difficult with the method.

Through extensive research focused on the various technical problems presented by directly forming bumps on an IC wafer before wafer dicing, the inventors of the present invention proposed, in Japanese Patent application No. 3-323064, a bump bonding apparatus and bump forming method that effectively resolves the above-noted problems.

However, while the above-noted bump bonding apparatus and bump forming method effectively solves the conventional problems described above, there remain a number of technical problems to be solved in order to yet further improve productivity, reduce cost, and improve quality.

With a conventional bump bonding apparatus, for example, the wafers are stored and supplied to the bump bonding apparatus in a stack on a plurality of shelves formed in the carrier. To make positioning the wafers on the bonding stage easier, a position regulating means is provided on the extractor for extracting the wafers from the carrier. A four-points chuck holds the wafer at four points after regulating the orientation flat to be oriented in a specific direction using the position regulating means, and moves the wafer to the bonding stage. Inserting the wafers in the carrier is a manual task performed by the operator. The operator must carefully insert each wafer in the carrier with the orientation flat oriented in a specific direction, so that the later positioning operation can proceed smoothly.

This means that the operator may need to repeatedly handle a wafer in order to position the orientation flat properly. In addition to making the operator work greater, this also increases the potential for damage to high cost wafers. Further, in such a case, the wafer is regulated for its position before being transported to the bonding stage. This also increases the number of times for wafer handling, and thus increases the potential for wafer damage.

Also further, when the chuck holds the wafer at several points around the edge of the wafer for transport, it is also possible for one of the chucking points to be on the orientation flat of the wafer. If the chuck holds the wafer at only a few points, such as four points in the case of a 4-chucking points type chuck, the wafer may not be properly centered in the chuck. This means that despite efforts to regulate the wafer for its position, the orientation flat may become out of position, while the wafer is transported onto the bonding stage.

A sensor provided on the bonding stage is also used to detect the position of the orientation flat on the boding stage in a conventional bump bonding apparatus. The bonding stage typically reaches temperatures of approximately 300 degrees centigrade. Therefore, expensive heat resistant sensors capable of withstanding such temperatures must be used for the orientation flat sensor, and this contributes to higher cost.

A conventional bump bonding apparatus also typically has an orientation flat sensor located on only one side of the bonding stage. This makes wafer positioning difficult when the wafer is divided circumferentially into plural segments for bump formation, and the wafer is sequentially turned about its center to form bumps in one section at a time. The air blowing means that is used for pushing the wafer to one side is also provided only in one direction, on which the orientation flat sensor is mounted. Furthermore, while only one orientation flat sensor is provided, a plurality of sensors is preferably provided along the base line of the orientation flat (the cut edge on the outside edge of the wafer) to improve the precision for detecting the orientation flat.

As also noted above, in a conventional apparatus, the method is proposed, wherein the wafer is divided circumferentially into a plurality of segments and is turned about its center to sequentially form bumps in each segment, and an air blowing means for floating and turning is therefore used. In this case, however, since the wafer has been heated on the bonding stage and is also cooled down by the air flow for floating, turning, or, pushing it to one side, the resulting rapid temperature change may adversely affect the wafer.

Yet further, when the wafer is floated on air for a turn above the bonding stage, consistently stable wafer turning is needed in order to increase orientation flat detection precision. Depending upon such factors as the wafer material and shape, however, stabilizing wafer turning under specific conditions can be difficult with conventional technology. For example, when the surface roughness on the back side of the wafer exceeds a particular level, such as with quartz and lithium tantalate wafers, the friction coefficient of the back side of the wafer to the bonding stage surface is high and the wafer does not slide easily. This makes it necessary to use a relatively strong air flow, but when the air flow is increased, air flow turbulence is increased. Thus, this makes it even more difficult to stabilize the wafer turning. A relatively strong air flow is also needed to start turning a heavy or large wafer. Increasing the air flow, however, also increases the effect of wafer inertia. This reduces the precision for stopping the wafer at the end of its turn, and thus leads to orientation flat detection error.

With consideration for the aforementioned problems of the related art, an object of the present invention is therefore to provide a bump bonding apparatus and bump formation method achieving a further increase in productivity, a reduction in cost, and an increase in quality when forming electrode bumps directly on a wafer before dicing it.

SUMMARY OF THE INVENTION

To achieve the above object, a first aspect of the present invention relates to a bump bonding apparatus for forming bumps by means of a bonding head on a wafer that has been transported onto a bonding stage using a wafer transporting means. In this case, a wafer has been previously regulated for its position so that an orientation flat formed at a circumferential edge of the wafer is oriented in a specific direction. The transporting portion of this bump bonding apparatus comprises an orientation flat detecting means for detecting the location of the orientation flat of the wafer on the bonding stage.

By thus providing the orientation flat detecting means on the transporting portion, the sensor is not subject to the high temperature heat of the bonding stage, which is different from the related art in which the sensor is provided on the bonding stage. It is therefore not necessary to use a particularly high temperature resistant sensor. Furthermore, since the orientation flat detecting means can move in conjunction with movement of the transporting portion, the location of orientation flat detection is not limited to one side of the bonding stage, which is different from the related art in which the sensor is fixed at one side of the bonding stage.

The orientation flat detecting means is preferably an optical sensor having a light emitting element and a receptor element, and is provided on a chucking means of the transporting portion. By using an optical sensor, the position of the orientation flat can be more reliably detected. In addition, by providing the sensor on the chucking means of the wafer transporting portion, the orientation flat can be detected from above the wafer, or more specifically from above the bonding stage, thereby more reliably avoiding the effects of heat from the bonding stage.

Yet further preferably, there is a plurality of the detecting means arranged in a direction perpendicular to the travel direction of the transporting portion. By thus arranging a plurality of the detecting means perpendicularly to the direction of the transporting means travel, orientation flat detection with even greater precision can be achieved.

Yet further preferably, a bevel with a specific slope is formed in the top surface of the bonding stage at and near the edge of the bonding stage. By thus forming appropriately sloped bevels on the bonding stage, when detecting an orientation flat from above the wafer, a detection light emitted from the detecting means is reflected at the bevel in different directions from that of incidence when the orientation flat is desirably positioned directly below the sensor. More specifically, when the orientation flat is positioned directly below the sensor, the detection beam will not be reflected from the top of the bonding stage back to the receptor, and will thus not interfere with orientation flat detection.

Yet further preferably, a pair of positioning rollers is provided on both right and left sides of the bonding stage. A floating air blower for floating a wafer, a turning air blower for turning a wafer, a first positioning air outlet for pushing a turning wafer to a pair of the positioning rollers on one side and stopping its turn, and a second positioning air outlet for pushing a turning wafer to a pair of the positioning rollers on the other side, are provided on the top surface of the bonding stage. A switching means is also provided for switching the air supply to the first and second regulating air outlets. It is therefore possible to push the wafer to either side of the bonding stage. In this case, since the orientation flat sensor can also move in conjunction with the transporting means, detecting the orientation flat is not limited to only one side of the bonding stage, and the orientation flat can be detected at either side of it.

A bump bonding apparatus according to a second aspect of the present invention forms bumps by means of a bonding head on a wafer supplied to a bonding stage. The apparatus has a pair of positioning rollers disposed on both right and left sides of the bonding stage and has, on the top surface of the bonding stage, a floating air blower for floating a wafer and a turning air blower for turning a wafer, and a positioning air outlet for pushing a turning wafer to a pair of the positioning rollers on at least one side and stopping its turn. The bonding stage comprises a stage plate in which the air outlets are disposed, a heat block disposed below the stage plate, and an air chamber provided in the stage plate. The air chamber leads to each of the air outlets and can temporarily store supply air from outside.

The air chamber in this bump bonding apparatus allows the supply air from outside to warm a certain degree in the air chamber before it is ejected from the air outlets to the bottom of the wafer. Thus, when air is blown from the air outlets against the bottom of the wafer to float, turn, or position a wafer heated on the bonding stage, the temperature gradient of ejected-air cooling of the heated wafer is more gradual than with a conventional bump bonding apparatus. Thus, the effects of wafer cooling by these ejected-air streams can be effectively avoided.

A bump bonding apparatus according to a third aspect of the present invention forms bumps by means of a bonding head on a wafer supplied to a bonding stage. This apparatus has on the top surface of the bonding stage a floating air blower for floating a wafer and a turning air blower for turning a wafer, and the air flow from the turning air blower against a back side of the wafer during wafer turn is variable.

By thus varying the air flow against the backside of the wafer during wafer turn, the air flow can be adjusted according to the wafer material, shape, and size. The air flow can thus be controlled to achieve stable wafer turn.

Yet further preferably, the turning air blower comprises: a plurality of turning air outlets disposed in the substantial same circumference on the top of the bonding stage; an air supply path of which one end leads to the turning air outlets, and the other end branches; a normal turning air supplying means disposed at one branch of the air supply path; and an auxiliary turning air supplying means disposed at another branch of the air supply path and operable in addition to the normal turning air supplying means. Additionally, the air flow to the back side of a wafer from the turning air blower can be changed by controlling the air supplying means to supply air at a specific flow rate. Therefore, it is possible to control the air flow to a specific level at the air supplying means disposed on the opposite end of the air supply path from the plurality of turning air outlets. Thereby, the air flow to the back side of the wafer from the turning air outlets is varied. Air supply can thus be adjusted according to the wafer material, size, and shape to achieve stable wafer turn. It is also possible to smoothly slow wafer turn from high speed to low speed without completely interrupting the air supply because air supplied from both supplying means is ejected from the same air outlets.

Alternatively, the turning air blower comprises: a plurality of turning air outlets disposed on a first circumference on the top of the bonding stage; an auxiliary turning air outlet disposed on a second circumference on the top of the bonding stage; a normal turning air supplying means disposed at the other end of an air supply path of which a first end leads to turning air outlets; and an auxiliary turning air supplying means disposed at the other end of an air supply path of which a first end leads to auxiliary turning air outlets, and which is operable in addition to the normal turning air supplying means. In this case, the air flow to the back side of a wafer from the turning air blower can be changed by controlling the air supplying means to supply air at a specific flow rate. Therefore, it is possible to control the air flow to a specific level at the air supplying means disposed on the opposite end of the air supply path from the plurality of turning air outlets, and thereby vary the air flow to the back side of the wafer from the turning air outlets. Air supply can thus be adjusted according to the wafer material, size, and shape to achieve stable wafer turn.

Yet further preferably, air flow is controllable in the normal turning air blower and/or the auxiliary turning air blower. This enables even more precise control of the air flow from the air outlets, enables air flow to be smoothly changed, and can thus further stabilize wafer turn.

Yet further preferably, the air flow to the backside of the wafer during wafer turn is controllable by supplying air in steps from the auxiliary turning air blower. By thus enabling air flow from the auxiliary turning air blower to be increased in steps at the start of turning, air flow from the air outlets can be smoothly changed, wafer turn can be gradually started, and wafer slipping due to rapid starting can be prevented. Further, the air flow to the backside of the wafer during wafer turn is controllable by intermittently supplying air from the auxiliary turning air blower. By thus intermittently supplying auxiliary air during wafer turn, low speed, stable wafer turn can be maintained even with wafers having a surface roughness on the back side exceeding a particular level that tends to cause the wafer to stop easily on the bonding stage.

Yet further preferably, the air outlets of the turning air blower are disposed on top of the bonding stage on a circumference at or near the wafer edge, or a circumference thereinside. In this case, air for turning the wafer is ejected from the bonding stage, thereby distributing torque across the backside of the wafer and enabling stable wafer turn. This is particularly effective with large wafers.

There is yet further preferably an orientation flat detecting means for detecting the position of a wafer orientation flat on the bonding stage. It is thus possible to detect the position of the orientation flat after the wafer is turned on the bonding stage, and thereby confirm the orientation of the wafer on the bonding stage.

A bump bonding apparatus according to a fourth aspect of the present invention forms bumps by means of a bonding head on a wafer, which has been previously regulated for its position so that an orientation flat formed at a circumferential edge of the wafer is oriented in a specific direction, and has been transported onto a bonding stage by a transporting portion. The transporting portion comprises a chucking means for holding a wafer at six points.

With the 6-points chucking means of the present invention, the wafer will not be shifted off-center even if the chuck holds the wafer with one of the chucking points being on the orientation flat. Thus, offset positioning of the orientation flat can be effectively prevented when a wafer is transported onto the bonding stage, which is different from a 4-points chucking means.

A bump bonding apparatus according to a fifth aspect of the present invention has a loading station having a carrier for storing a plurality of wafers stacked therein with a specific gap therebetween, and a lifter for positioning the carrier at a specific vertical position. This apparatus forms bumps by means of a bonding head on a wafer extracted from the carrier by an extracting means and placed on a bonding stage by means of a transporting means. It further comprises at the loading station: a detecting means for detecting whether an orientation flat of a wafer in the carrier is within a specific range for a reference position, and means for notifying the operator when the detecting means detects the orientation flat to not be within this specific range for the reference position.

The orientation flat detecting means can thus reliably detect whether the wafer is desirably positioned, and the operator can be notified of the result. The operator's task of inserting wafers into the carrier is thus made easier, the job of adjusting the position of the orientation flat can be simplified, and the need for manually handling the wafers can be reduced. It is to be noted that the orientation flat detecting means is preferably located at the lifter of the loading station.

Yet further preferably the orientation flat detecting means is a plurality of optical sensors having a light emitting element and a receptor element disposed perpendicularly to the direction of wafer extraction from the carrier. Using optical sensors for the orientation flat detecting means thus assures reliable orientation flat detection, while also simplifying both the detecting means and its mounting structure. Providing a plurality of sensors as described above also enables even higher detection precision.

A bump bonding method according to a sixth aspect of the present invention forms bumps on a wafer supplied to a bonding stage by means of a bonding head. A floating air blower for floating a wafer and a turning air blower for turning a wafer are provided on the bonding stage, and the method comprises a step for variably controlling air flow from the turning air blower to a back side of the wafer during wafer turn.

It is therefore possible to vary the air flow to the back side of the wafer during wafer turn, and thus adjust the air supply according to the wafer material, size, and shape to achieve stable wafer turn.

Yet further preferably, in step for variably controlling air flow from the turning air blower during wafer turn, air from the turning air blower is supplied by stages. By thus increasing turning air flow by stages at the start of the turning, air flow from the air outlets can be smoothly changed, wafer turn can be gradually started, and wafer slipping due to rapid starting can be prevented.

Further alternatively, the air flow to the backside of the wafer during wafer turn can be intermittently supplied from the auxiliary turning air blower. By thus intermittently supplying air during wafer turn, low speed, stable wafer turn can be maintained even with wafers having a surface roughness on the back side exceeding a particular level that tends to cause the wafer to stop easily on the bonding stage.

Yet further preferably, an orientation flat detecting means is provided for detecting the position of the orientation flat of a wafer on the bonding stage after wafer turn. In this case, the position of the orientation flat can be detected after wafer turn to confirm the orientation of the wafer on the bonding stage.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 4A to FIG. 4C illustrate the bonding process of the bump bonding apparatus as shown in FIG. 1, FIG. 4A being a section view of ball formation process, FIG. 4B being a section view of the process in which the ball is bonded to an electrode, and FIG. 4C being a section view of the process of cutting the wire and forming the bump;

FIG. 8A to FIG. 8D illustrate the orientation flat detection operation of the detecting means on the lifter, FIG. 8A showing the wafer with a curved edge thereof covering one detecting means, FIG. 8B showing the wafer with a curved edge thereof covering both detecting means, FIG. 8C showing the wafer with the orientation flat thereof covering one detecting means, and FIG. 8D showing the wafer stored with the orientation flat parallel to a line between the detecting means;

DETAILED DESCRIPTION OF THE INVENTION

A first preferred embodiment of the present invention is described below with reference to the accompanying FIGS. 1 to 23.

Figure 1:
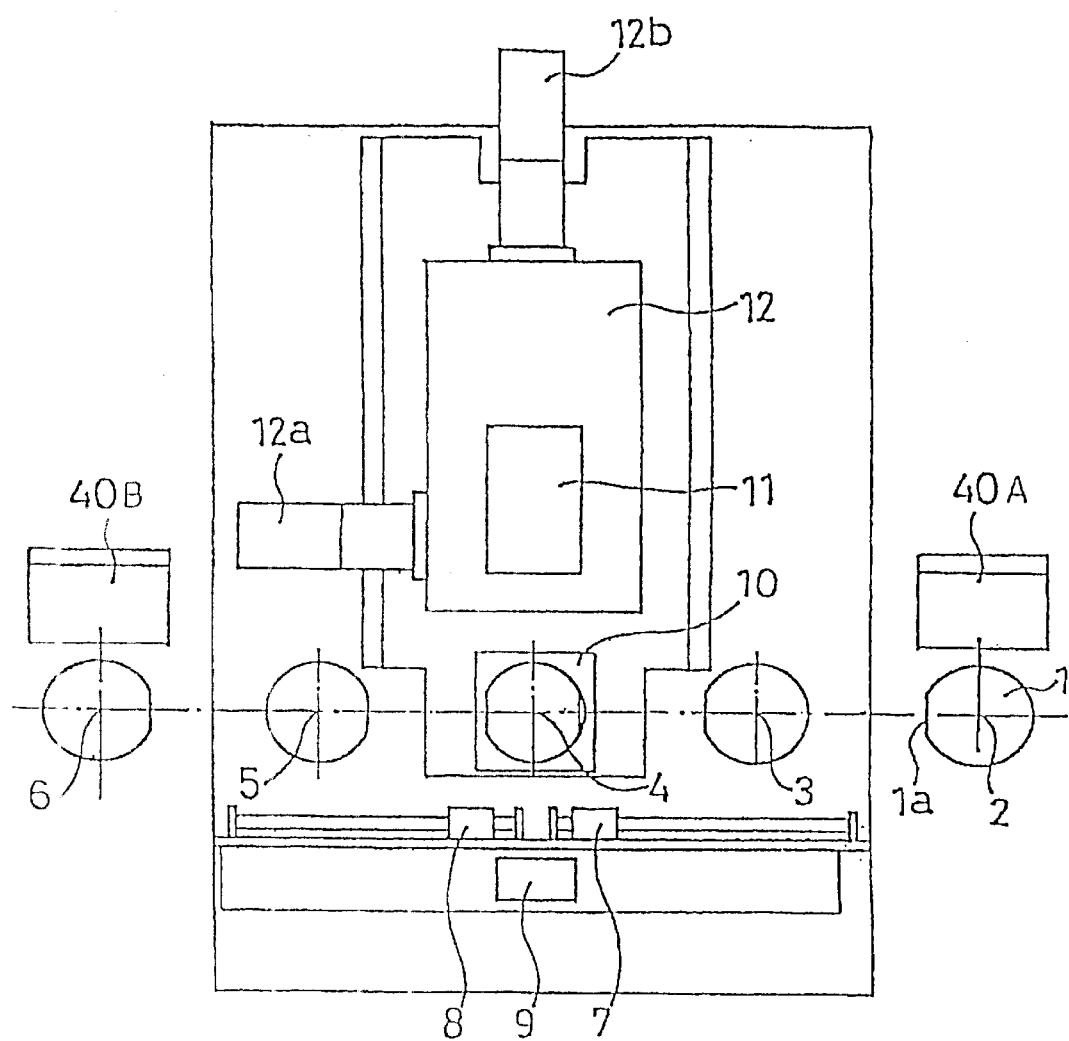
FIG. 1 is a plan view showing the overall configuration of a bump bonding apparatus according to a preferred embodiment of the present invention.

Referring to FIG. 1 first, the overall arrangement of a bump bonding apparatus according to this preferred embodiment of the invention is described. This bump bonding apparatus is designed for bonding a disc-shaped wafer 1 having an orientation flat, which is formed by cutting an edge part of the wafer 1 so that the crystal orientation of the wafer 1 can be determined by orientating the orientation flat in a specific direction.

This bump bonding apparatus is further designed for forming bumps on the individual IC chips in a wafer before the wafer 1 is diced to separate the individual IC chips. The bump bonding apparatus comprises the following major components to accomplish this: a loading station 2 which loads a carrier with stored wafers 1, a transporting station 3 on the loading side of a bonding station 4 for regulating the position of a wafer 1 extracted from the carrier; the bonding station 4 for forming bumps; a transporting station 5 on the unloading side of the bonding station 4 for regulating the position of a wafer 1 on which bumps have been formed; and an unloading station 6 for inserting wafers 1 on which bumps have been formed by one at a time to a carrier and conveying it to a subsequent process. An extracting means 7 for extracting a wafer 1 from the loading station 2 to the transporting station 3 on the loading side, and an inserting means 8 for inserting a wafer 1 from the transporting station 5 on the unloading side into the unloading station 6, are further disposed in front of the moving line for wafer 1. A transporting means 9 for moving a wafer I from the transporting station 3 on the loading side to the bonding station 4, and from the bonding station 4 to the transporting station 5 on the unloading side, is further disposed in front of the extracting means 7 and inserting means 8.

A bonding stage 10, which is a heatable stage for bonding using ultrasonic thermal fusion, is disposed at the bonding station 4, and a bonding head 11 is disposed behind the bonding stage 10. The bonding head 11 is supported on an X-Y table 12 which can be moved and positioned as desired by means of an X axis motor 12a and a Y axis motor 12b, and thus can move freely along two axes, X and Y.

Figure 2:
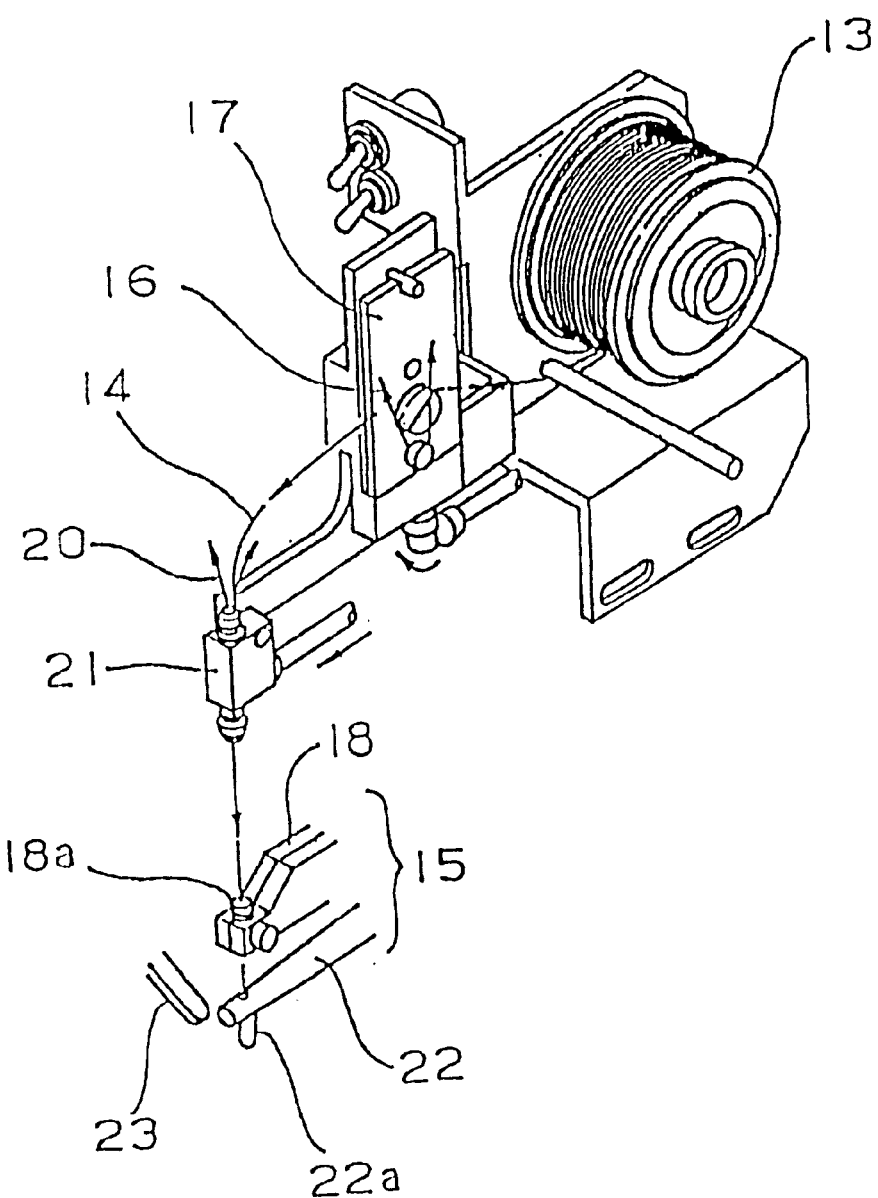
FIG. 2 is a perspective view of a wire feeding mechanism at the bonding head of a bump bonding apparatus as shown in FIG. 1.

As shown in FIG. 2, the bonding head 11 comprises a wire tensioner 17 and a wire tensioner 21 disposed between a wire reel 13 and bonding assembly 15 which bonds wire 14 to a wafer 1 located on the bonding stage 10. The wire tensioners allow the wire 14 to be supplied from the wire reel 13 smoothly and without resistance to the bonding assembly 15. The wire tensioners 17 and 21 can accomplish this by using air streams 16 and 20 SO that the wire 14 is floated on air streams maintaining a specific tension and supply path. The wire 14 is supplied to the bonding assembly 15 from a wire reel 13 located at a higher position than the bonding assembly 15. Located between the wire reel 13 and damper 18, the first wire tensioner 17 directs an air stream 16 to the wire 14 so that the wire is lifted in an upward curve and tension is thus applied to the wire 14. Located directly above a wire guide 18a of the damper 18 in the bonding assembly 15, the second wire tensioner 21 directs another air stream 20 to the wire 14 to push up the wire 14 and apply an upward tension to it.

Figure 3:
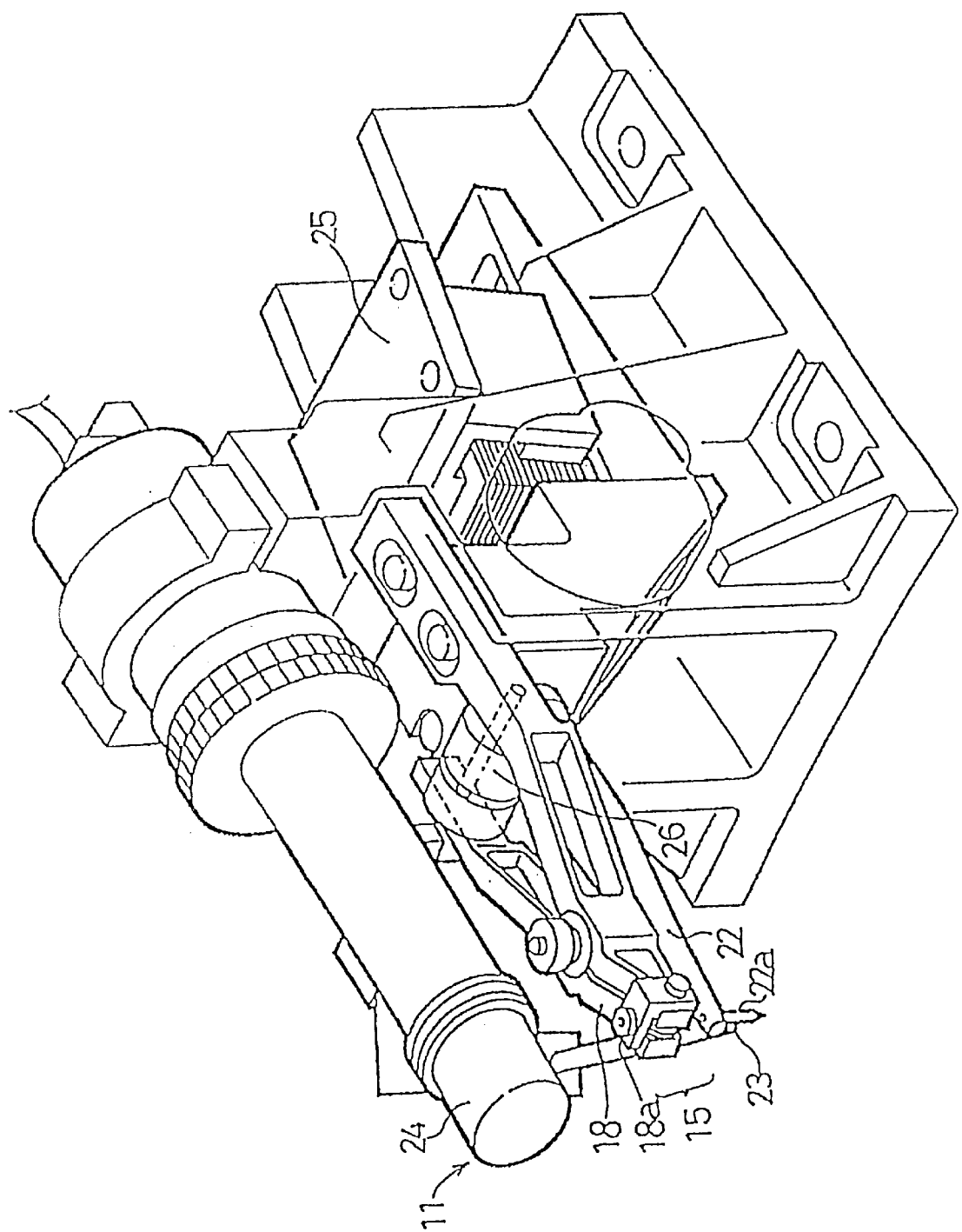
FIG. 3 is a perspective view of the bonding head with the wire feeding mechanism omitted.

As shown in FIG. 2 and FIG. 3, the bonding assembly 15 comprises the damper 18 for holding the wire 14, a horn 22 having at the tip thereof a capillary 22a through which passes wire 14, and a discharge torch 23. The horn 22 applies ultrasonic vibration to a ball 14a formed at the tip of the horn 22 (see FIGS. 4A–4C). A camera 24 for visually checking the quality of the bonding operation is located above the bonding assembly 15. Images captured by the camera 24 are displayed on a monitor (not shown in the figures), and a recognition signal is input to a data processing device (not shown in the figures) for data processing. Also provided are an electromagnetic rocking driver 25 for lifting the tip of the bonding assembly 15 up and down by rocking the bonding assembly 15 about a pivot point not shown in the figures, and an electromagnetic driver 26 for opening and closing the clamper 18.

Referring to FIG. 4, bonding is accomplished by feeding the wire 14 through capillary 22a, and melting the end of the wire by means of a spark current from the discharge torch 23 to form a ball 14a as shown in FIG. 4A, each time the bonding head 11 moves to a position opposite a specific electrode 27 on the wafer 1. The position of the wire 14 with respect to each electrode 27 is controlled with high precision based on visual recognition by the camera 24. The ball 14a is bonded to an electrode 27 on the wafer 1 by means of thermal compression and ultrasonic vibration as shown in FIG. 4B. A force of 30 g to 50 g is desirable at this time. Ultrasonic vibration is preferably applied in a horizontal direction at amplitude of 0.5 pm and a frequency of 60 to 70 kHz (desirably 63.5 kHz). The wire is then cut by lifting the capillary 22a and damper 18 holding the wire 14 up as shown in FIG. 4C, thus forming a bump 28 projecting to a total height of approximately 60 $\mu$m including the ball 14a and wire 14b projecting therefrom approximately 30 $\mu$m to 40 $\mu$m. The To assures that the wire 14 is cut at a specific position, and the wire 14 is selected to have a high Young's modulus and low thermal conductivity.

Next, moving, transporting, and positioning the wafer 1 at each of the stations 2 to 6 are described.

Figure 5A:
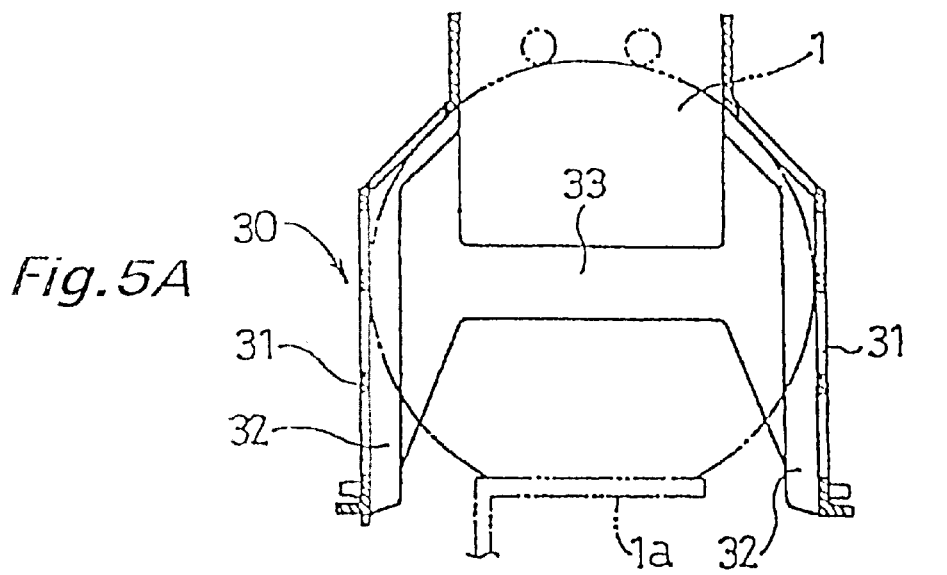
FIG. 5A to FIG. 5C show a carrier for wafer transportation in a bump bonding apparatus as shown in FIG. 1, FIG. 5A being a plan view in section through line A—A in FIG. 5B, and FIG. 5B being a front view, and FIG. 5C being a bottom view.
Figure 5B:
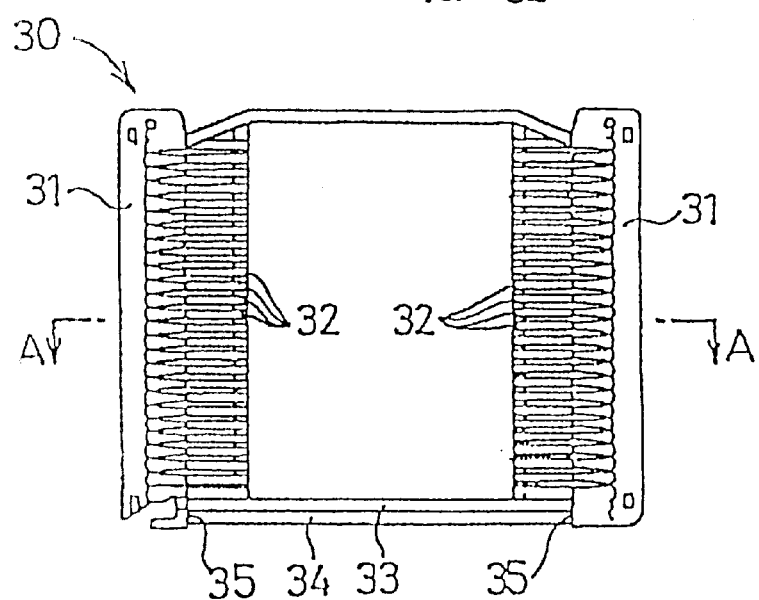
Figure 5C:
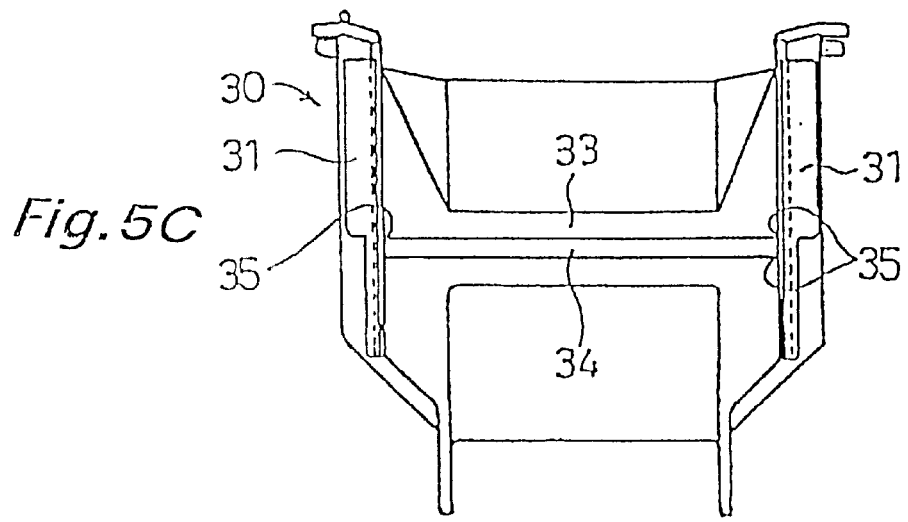

Referring to FIG. 5, carriers 30 for loading and unloading the wafers 1 are described first. The carriers 30 store a plurality of wafers 1 stacked together with an appropriate gap therebetween. The carriers 30 are approximately rectangular box-like frames open at both front and backside, wherein the back is tapered toward the rear so that the wafers 1 cannot slip out of the back. A series of shelves 32 (24 rows of shelves 32) are formed on both sidewalls 31. The edges of each wafer 1 are inserted into and held by matching shelves 32. A rib 34 crossing from side to side projects from the bottom surface of an H-shaped bottom wall 33, and the front and back corners at both ends of the rib 34 form positioning parts 35.

Figure 6:
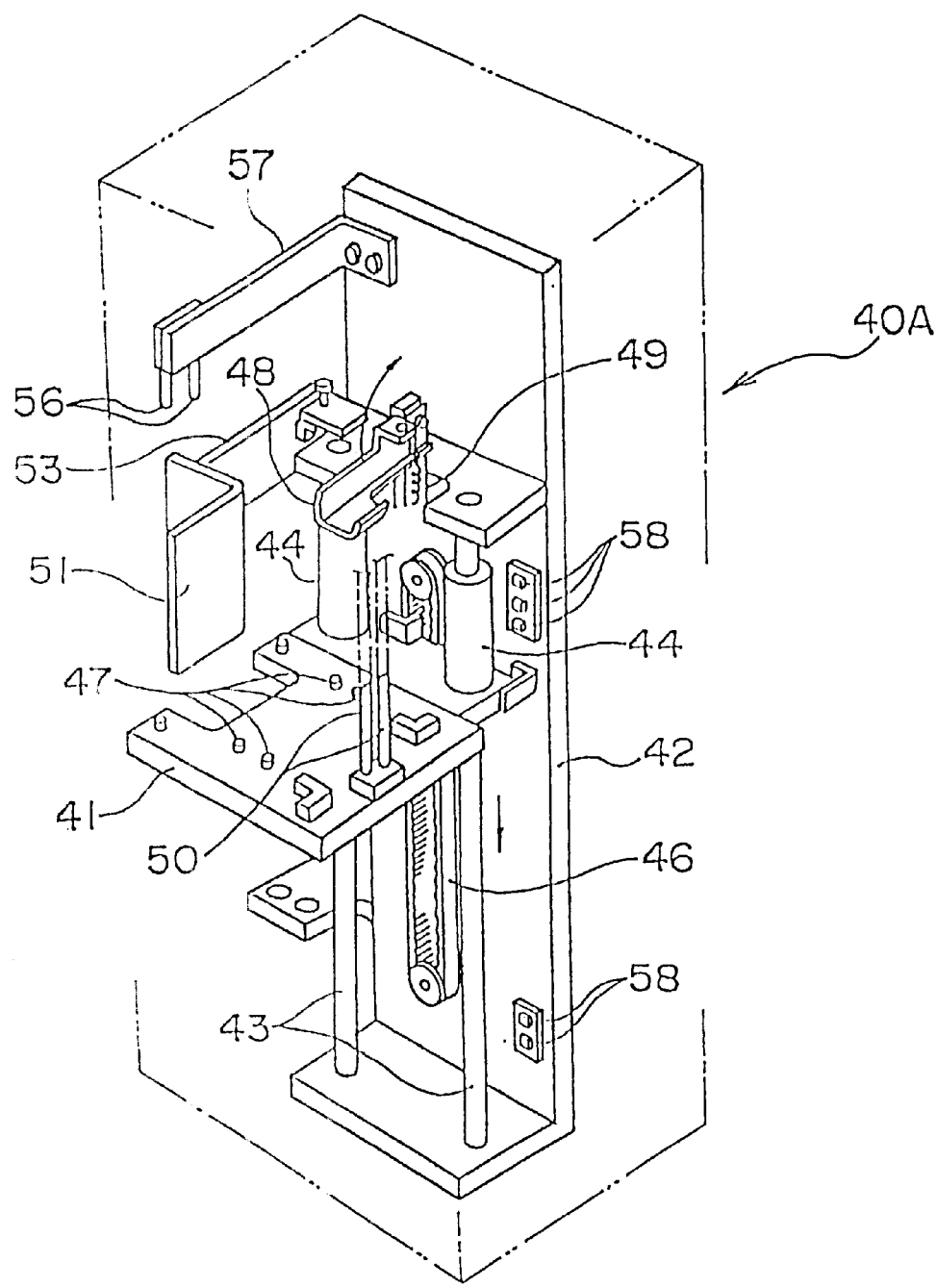
FIG. 6 is a perspective view showing the major components of a lifter disposed at a loading station in a bump bonding apparatus as shown in FIG. 1.
Figure 7:
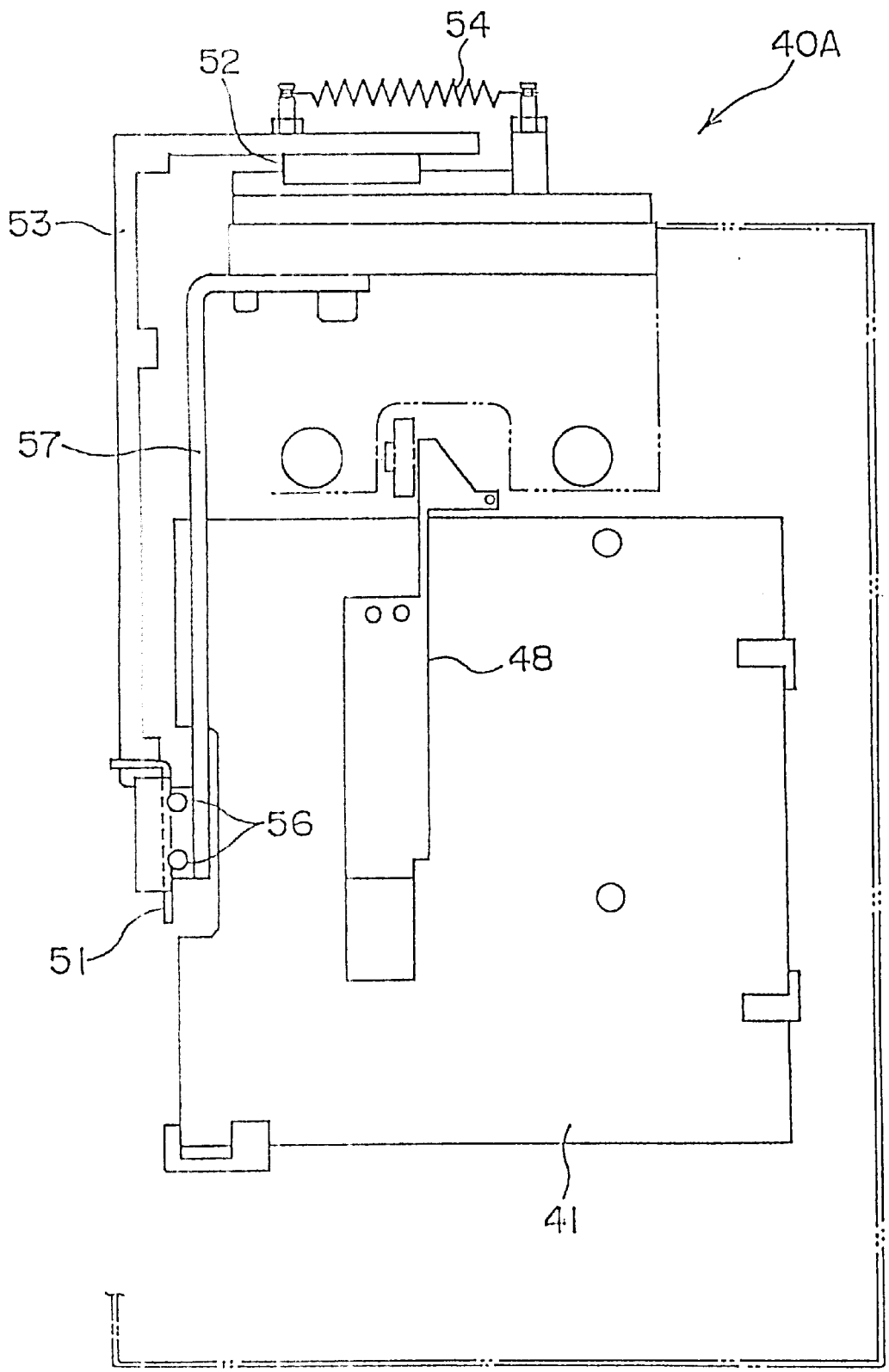
FIG. 7 is a plan view of the lifter in FIG. 6.

A lifter 40A as shown in FIG. 6 and FIG. 7 is disposed at the loading station 2. The carrier 30 on the loading side is placed from above onto an elevator platform 41. A pair of vertical guide shafts 43 are fixed at top and bottom ends to a stationary frame 42. The elevator platform 41 is supported by way of slide bearings 44 so that it can be moved freely up and down on the guide shafts 43 by means of a servo motor (not shown in the figures) mounted on the back side of the stationary frame 42 and a timing belt 46 that can be driven in forward and reverse by the servo motor. Four positioning pins 47 project from the top of the elevator platform 41. These positioning pins 47 engage the four positioning parts 35 of the carrier 30 on the loading side, thereby positioning the carrier 30 on the platform 41. A holding lever 48 is forced into a horizontal position from above by means of a spring 49 against which the holding lever 48 can retract upward, so that the holding lever 48 bears downward against the carrier 30 on the elevator platform 41. As the elevator platform 41 travels vertically, the wafers 1 stored in the carrier 30 are positioned at a specific wafer extraction height sequentially from the bottommost wafer 1 in the carrier 30. Limit switches 58 disposed on a front surface of the stationary frame 42 detect specific elevator platform 41 positions, that is, an up position limit, down position limit, home position, and a safety stop position when the elevator platform 41 moves above or below the up and down position limits.

If the direction from which the wafers 1 are extracted from the carrier 30 is the front, a pair of positioning bars 50 are vertically disposed at the back side of the elevator platform 41. These positioning bars 50 contact two points at a back edge of each of the wafers in the carrier 30. The lifter 40A further comprises a shutter 51 extending from the stationary frame 42 to prevent the wafers 1 from falling out from the carrier 30. To accomplish this, the shutter 51 enters the front of the carrier 30 and lightly contacts orientation flats 1a of the wafers 1 inside the carrier 30. The bottom edge of the shutter 51 is slightly above the wafer 1 extraction height so that the shutter 51 does not interfere with extracting the wafers from the carrier 30. The shutter 51 is affixed to a sliding member 53, which is supported at the backside of the stationary frame 42 freely slidable in the wafer extracting direction on a slide guide 52. A spring 54 urges the sliding member 53 backward in the wafer extracting direction. Note that this shutter mechanism is adjusted so that there is a small gap of approximately 0.5 mm between the orientation flats 1a and the shutter 51 when the wafers 1 are in contact with the positioning bars 50.

The lifter 40A further comprises a detecting means for detecting the orientation of a wafer 1 stored in the carrier 30 based on the position of the orientation flat 1a. More specifically, an arm 57 extending along the front of the elevator platform 41 is affixed near the top of the stationary frame 42, and two sensors 56 (56A and 56B) are disposed on the arm 57 in a direction perpendicular to the direction in which the wafers are extracted from the carrier 30. These sensors 56A and 56B detect whether the position of the orientation flat 1a of a wafer 1 in the carrier 30 is within a specific range. In this preferred embodiment of the present invention, these sensors 56 are optical sensors comprising a light emitting element and a detector element.

An operation whereby the sensors 56 detect the positioning of a wafer 1 in the carrier 30 is described with reference to FIG. 8A to FIG. 8D.

FIG. 8A shows a wafer 1 positioned with part of the edge arc of the wafer 1 covering one sensor 56A. In this position, the orientation flat 1a of the wafer 1 is not orientated in a wafer extracting direction, and the position of the orientation flat 1a is therefore detected to be inappropriate for extraction.

FIG. 8B shows a wafer 1 positioned with part of the edge arc of the wafer 1 covering both sensors 56A and 56B. In this position, the orientation flat 1a of the wafer 1 is orientated in a direction substantially diametrically opposed to the wafer extracting direction, and the position of the orientation flat 1a is therefore detected to be inappropriate.

FIG. 8C shows a wafer 1 positioned with the orientation flat 1a edge of the wafer 1 covering one sensor 56A. In this position, the orientation flat 1a of the wafer 1 is orientated generally in the wafer extracting direction, but is at an angle to the line between the sensors 56A and 56B. The position of the orientation flat 1a is therefore detected to be inappropriate for extraction.

FIG. 8D shows a wafer 1 positioned with the orientation flat 1a edge of the wafer 1 substantially parallel to the line between the sensors 56A and 56B. In this position, the wafer 1 is correctly stored in the carrier 30, and is not detected by either sensor 56A or 56B.

When it is determined by this orientation flat detection operation that the position of the orientation flat 1a is not within a predetermined range, the operator is notified by means of an audible or visible alarm, such as a warning indicator, and the operator must manually correct the wafer 1 position.

With the detecting means thus described, it is not necessary to manually adjust the position of each wafer 1 so that the orientation flat 1a is orientated in a specific direction when storing the wafers in the carrier 30 as it is sufficient to adjust the wafer 1 position only when a positioning error is detected. In addition to thus making the operator's job easier, the detecting means also reduces the need for manually handling the wafers 1.

Figure 9:
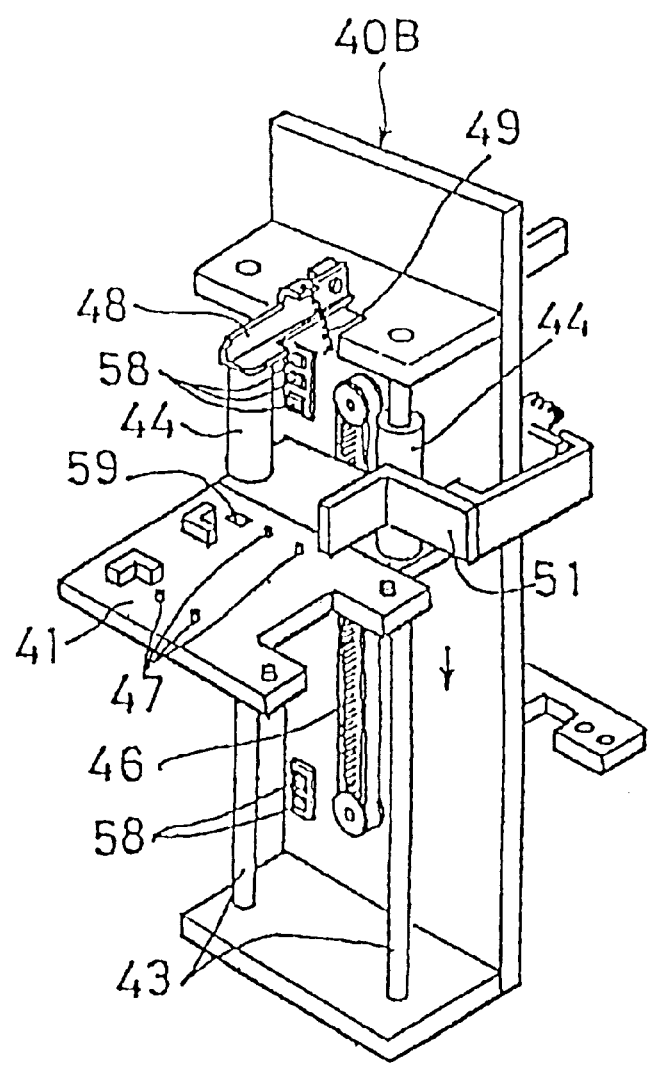
FIG. 9 is a perspective view showing the major components of a lifter disposed at an unloading station in a bump bonding apparatus as shown in FIG. 1.

The lifter 40B at the unloading station 6 is shown in FIG. 9. This lifter 40B is substantially identical to the lifter 40A at the loading station 2. Like parts in lifter 40A and lifter 40B are indicated by the same reference numerals below, and further description thereof is thus omitted below and only the differences are described.

The positioning bars 50 and sensors 56 on the sliding member 53 are not needed in this lifter 40B, and are therefore omitted. A carrier sensor 59 for detecting the presence of a carrier 30 is additionally provided. In addition, the shutter 51 can be fixed in position in this lifter 40B.

Next, the wafer extracting means 7 and inserting means 8 are described with reference to FIG. 10. It is to be noted that the extracting means 7 and inserting means 8 are substantially identical, and both are therefore described using the extracting means 7 by way of example.

Figure 10:
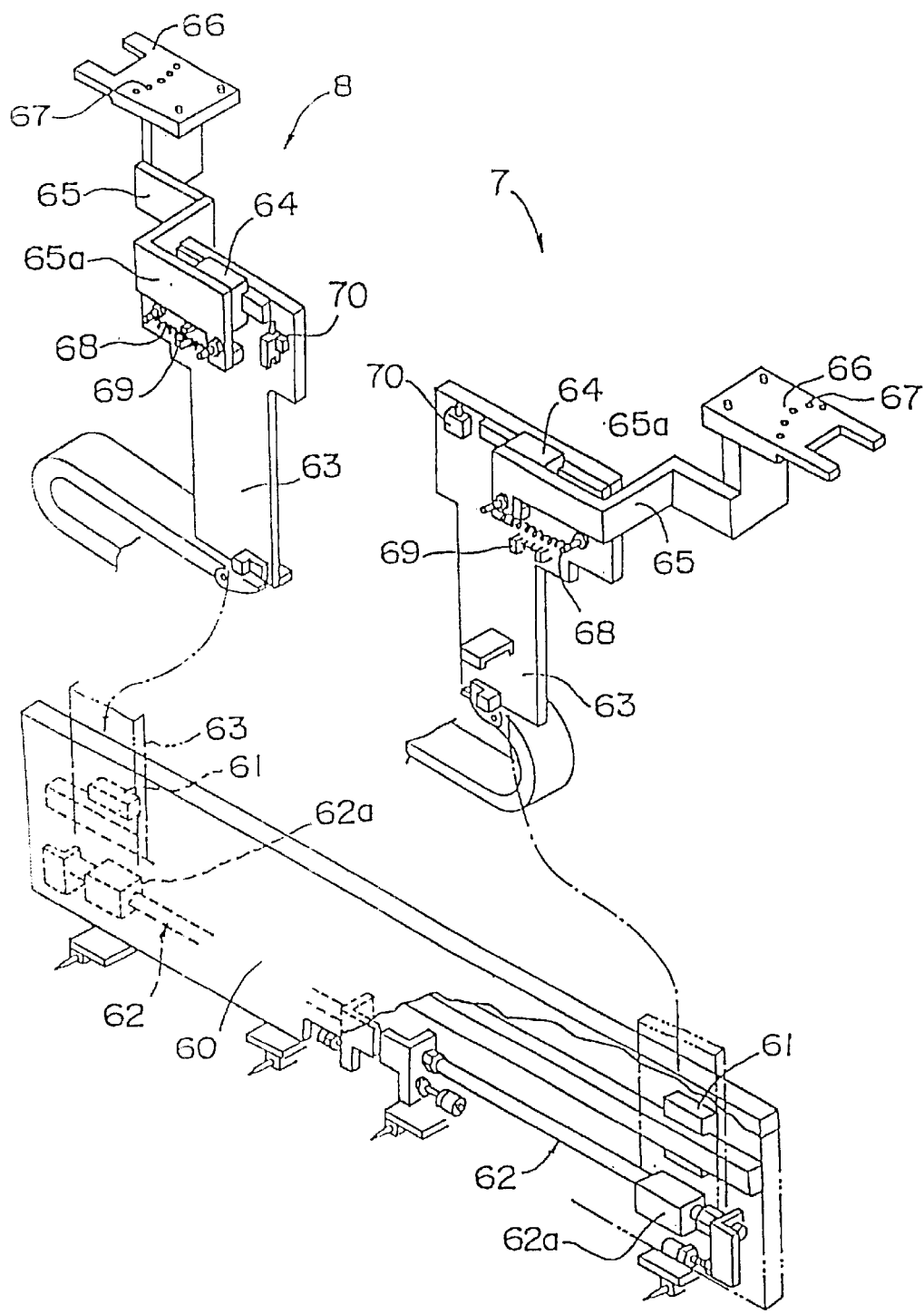
FIG. 10 is a perspective view showing the typical components of an extracting means and an insertion means in a bump bonding apparatus as shown in FIG. 1.

In FIG. 10, the bottom part of a moving support member 63 is supported so that it can move freely both ways, right and left as seen in the figure, in the wafer extracting direction along a slide guide 61 disposed on the back side of a fixed front frame 60. The bottom of the moving support member 63 is further linked to a moving part 62a of a rodless cylinder 62 so that it can be driven and positioned. A base 65a of a support arm 65 is movably supported in the moving direction of the moving support member 63 by way of a slide guide 64 at the top of the moving support member 63. A wafer receiver 66 with a suction chuck 67 for receiving and supporting the bottom of a wafer 1 is provided at the end of the support arm 65 extending towards the elevator platform 41 (see FIG. 6). The base 65a of the support arm 65 is urged by a spring 68 in the direction of the elevator platform 41 until it meets a stopper 69. A sensor 70 is further provided, which can detect if the wafer receiver 66 strikes an obstruction while moving and moves in resistance to the spring 68, and thus the operation can be immediately stopped to prevent damage in such case.

To extract a wafer from the carrier 30 by means of this extracting means 7, the wafer receiver 66 at the end of the support arm 65 is first inserted below the lowest wafer 1 in the carrier 30. The elevator platform 41 then descends until the wafer 1 is supported on the wafer receiver 66. The wafer 1 is then held on the wafer receiver 66 by means of suction chuck 67 as it is extracted from the carrier 30 into the transporting station 3.

To insert a wafer 1 into the carrier 30 at the unloading station 6 after bumps have been formed on the wafer 1, the wafer 1 is held by the suction chuck 67 on the wafer receiver 66 of the inserting means 8, and carried thereon from the transporting station 5 to the unloading station 6 for insertion into the carrier 30.

The transporting means 9 is described next with reference to FIG. 11 to FIG. 14.

Figure 11:
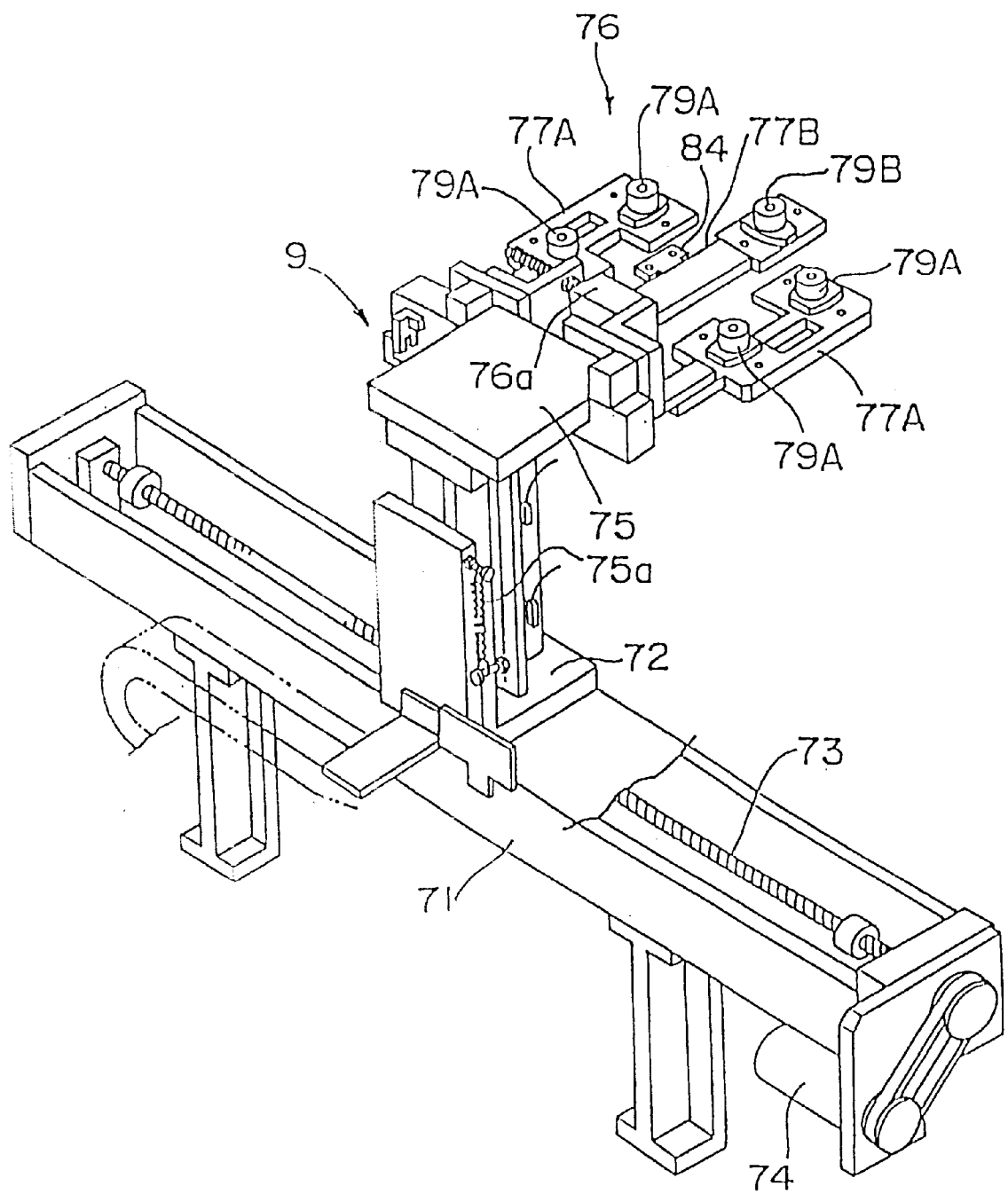
FIG. 11 is a perspective view showing the transporting portion of a bump bonding apparatus as shown in FIG. 1.
Figure 12:
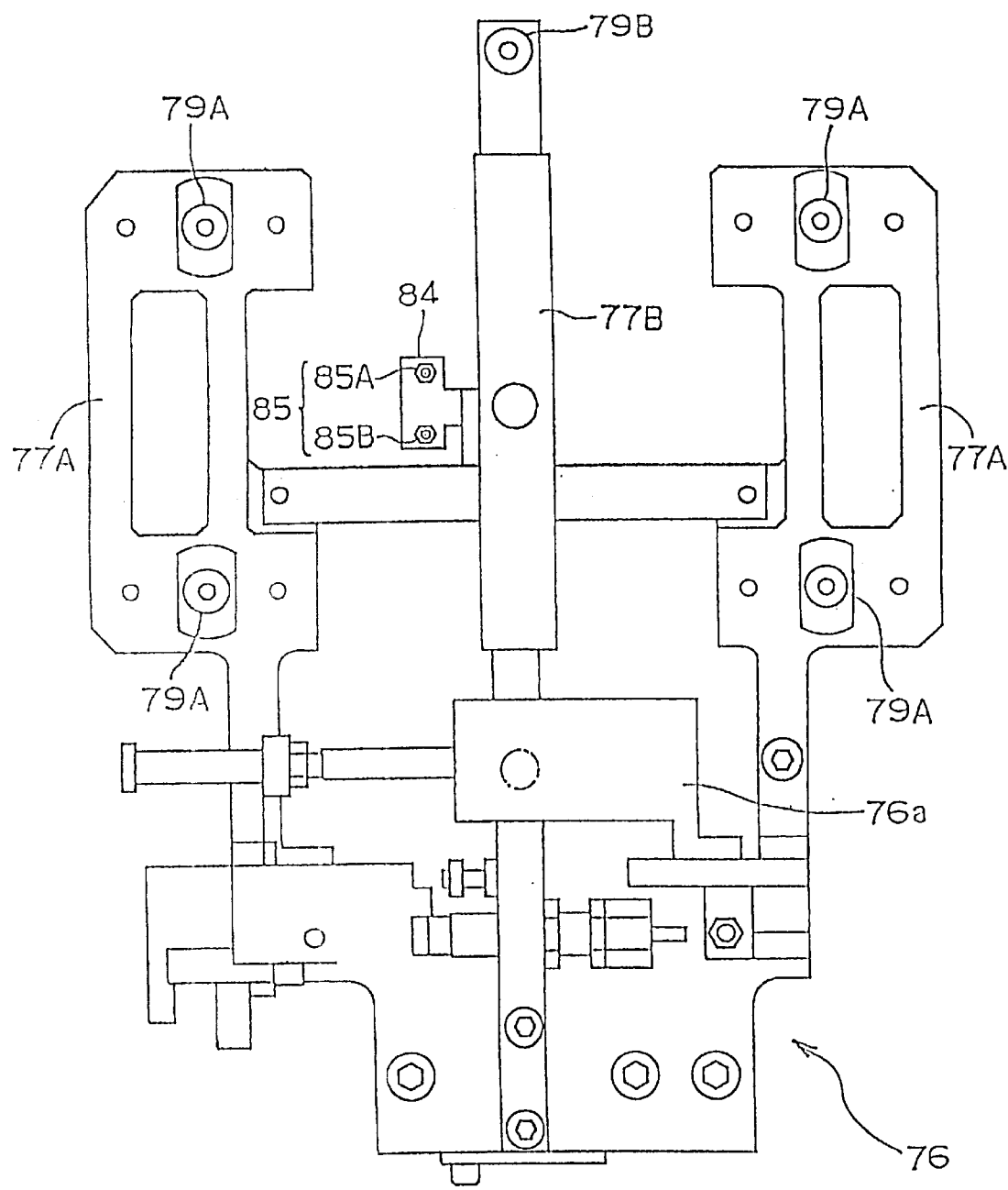
FIG. 12 is a plan view of a chuck in the transporting portion shown in FIG. 11.
Figure 13:
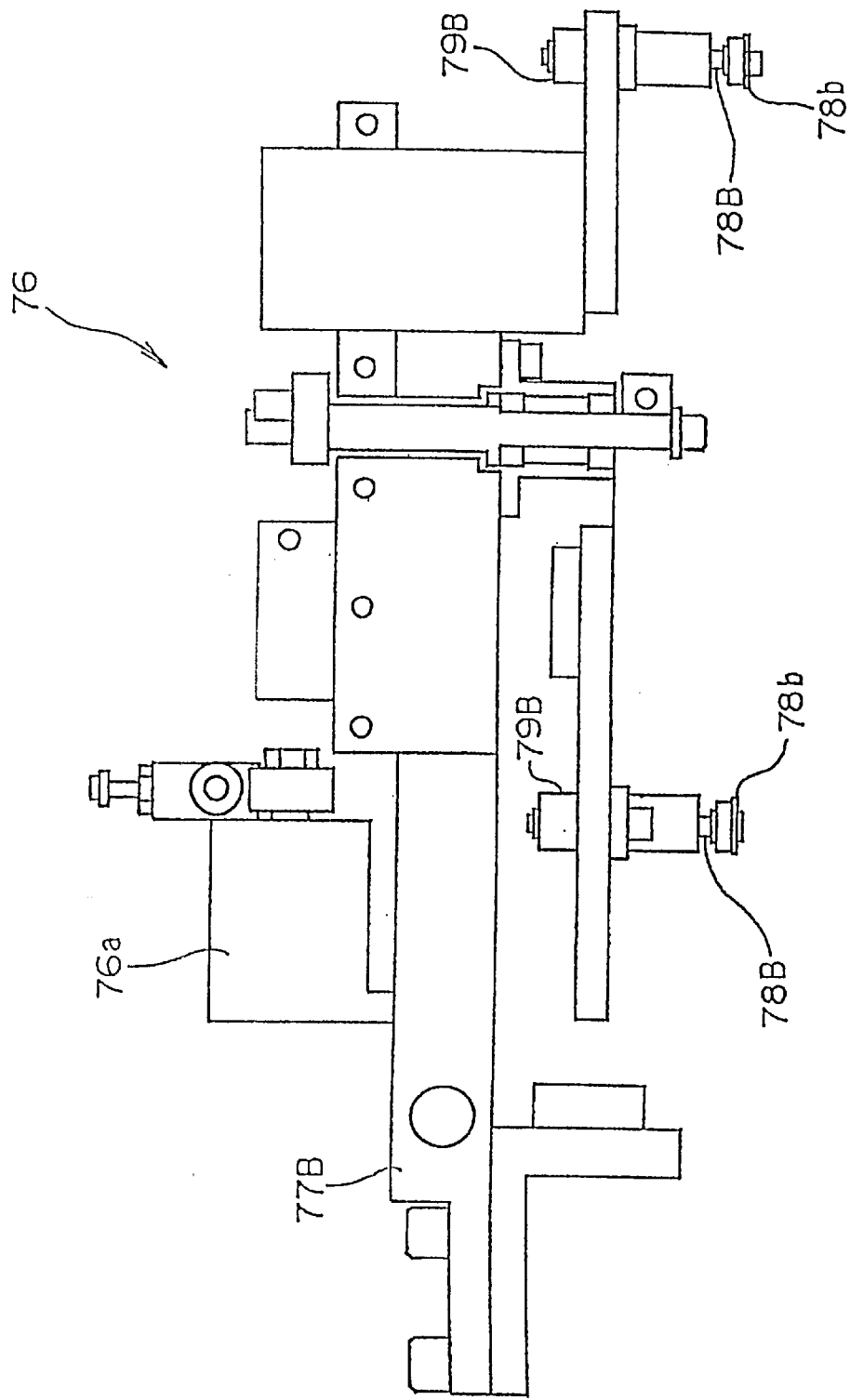
FIG. 13 is a side view of the holding part of the chuck shown in FIG. 12.
Figure 14:
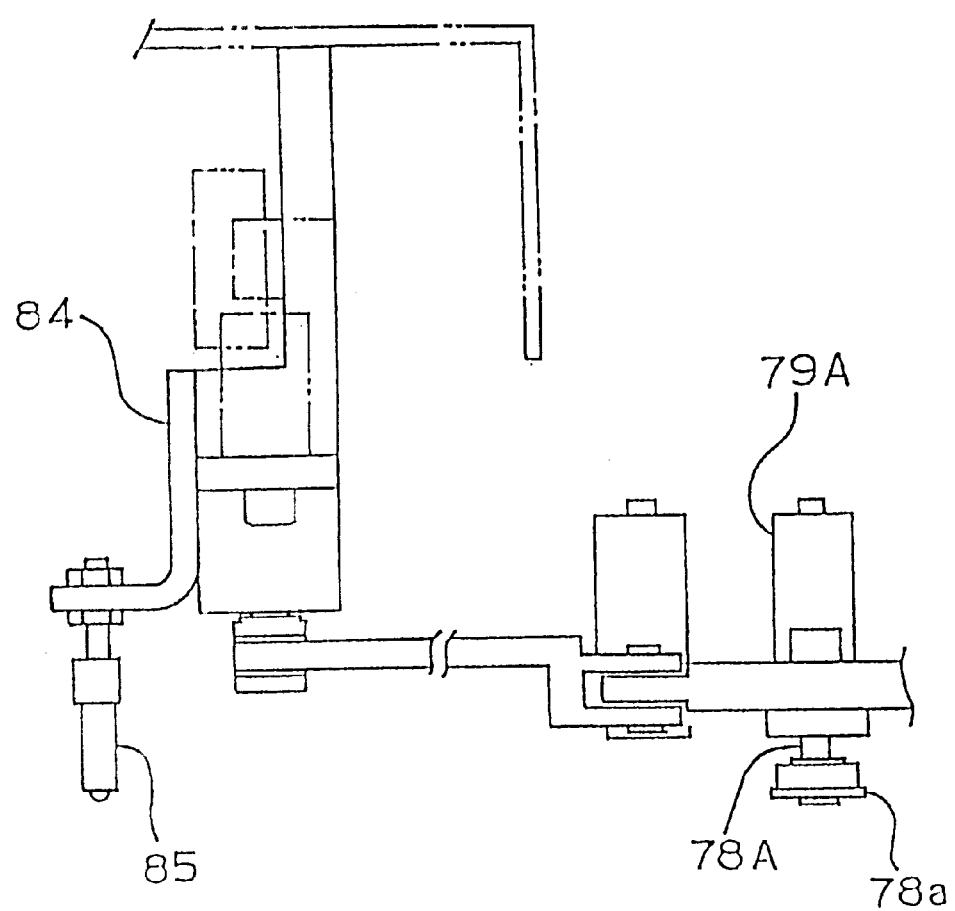
FIG. 14 is a side view of the detecting means of the chuck shown in FIG. 12.

FIG. 11 is a perspective view of the overall transporting means 9. A carriage 72 is provided on the moving means 71 that is parallel to the movement line for wafer 1. The carriage 72 can be driven on the moving means 71, and move between the transporting station 3 on the loading side, bonding station 4, and the transporting station 5 on the unloading side, and can be positioned appropriately. A ball screw 73 spanning the range of travel of the moving means 71 is rotationally driven by a servo motor 74. A nut threaded onto the ball screw 73 is affixed to the carriage 72. An elevator 75 is attached to the carriage 72 such that the elevator 75 can freely travel vertically. The elevator 75 is pushed normally upward to its top position limit by a spring 75a, and can be driven down to a bottom position limit by means of an internal cylinder. A chucking means 76 extends from the top edge of the elevator 75 so that it is positioned directly above the movement line for wafer 1.

The chucking means 76 comprises a pair of fingers 77A which can be opened and closed to each other by means of a cylinder 76a, and another finger 77B disposed horizontally between the other fingers 77A. Each of the fingers 77A has a pair of chucking pins 78A held vertically by an intervening floating mechanism 79A. The other finger 77B also has a pair of chucking pins 78B held vertically by an intervening floating mechanism 79B; these chucking pins 78B can be opened and closed to each other by means of a cylinder (not shown in the figures). A flange 78a, 78b is disposed at the bottom end of each of the chucking pins 78A, 78B to prevent the wafer 1 from dropping out.

It will be obvious that this chucking means 76 can be easily adapted for use with various sizes of wafers 1 by simply adjusting the position of the chucking pins 78A and 78B on the fingers 77A and 77B.

Two sensors 85 (85A and 85B) are mounted in a middle part of finger 77B by way of an intervening bracket 84. These sensors 85 can be of various types, but in this preferred embodiment of the invention they are optical sensors comprising a light emitting element and a receptor element, similar to the orientation flat sensors 56 of the loading station 2 described above. While described more fully below, the sensors 85 on this chucking means 76 are used in this exemplary embodiment for detecting the orientation flat or turn errors of the wafer 1 on the bonding stage 10. It is to be noted that these sensors 85 can detect the position of the orientation flat 1a from above the bonding stage 10, and can thus reliably avoid the effects of heat from the bonding stage 10.

When a wafer 1 is transported by the transporting means 9, the chucking means 76 is first opened, that is, the fingers 77A are separated from each other and the chucking pins 78B of the finger 77B are separated from each other. At the transporting station 3 or bonding station 4, the elevator 75 is lowered, and the chucking means 76 is then closed to hold a wafer 1 at six points around the circumference of the wafer 1 by means of the six chucking pins 78A and 78B. The elevator 75 is then raised to the top position limit, and the carriage 72 linked to the moving part 62a of the rodless cylinder 62 (see FIG. 10) is driven by way of the moving means 71. The base 65a of support arm 65 is fixed movably in the direction of moving support member 63 movement to the top of the moving support member 63 by way of an intervening slide guide 64. The wafer 1 can thus be moved and placed in the bonding station 4 or transporting station 5 by moving the support arm 65 to the bonding station 4 or transporting station 5, lowering the elevator 75, and opening the chucking means 76.

As noted above, with this 6-point chucking means 76, the wafer center will not be shifted off-center even if any of the chucking pins 78A and 78B is on the orientation flat 1a when the wafer 1 is picked up, which is different from the conventional 4-point chucking means. Offset positioning of the orientation flat when a wafer is transported to the bonding stage 10 can thus be effectively prevented.

Figure 15:
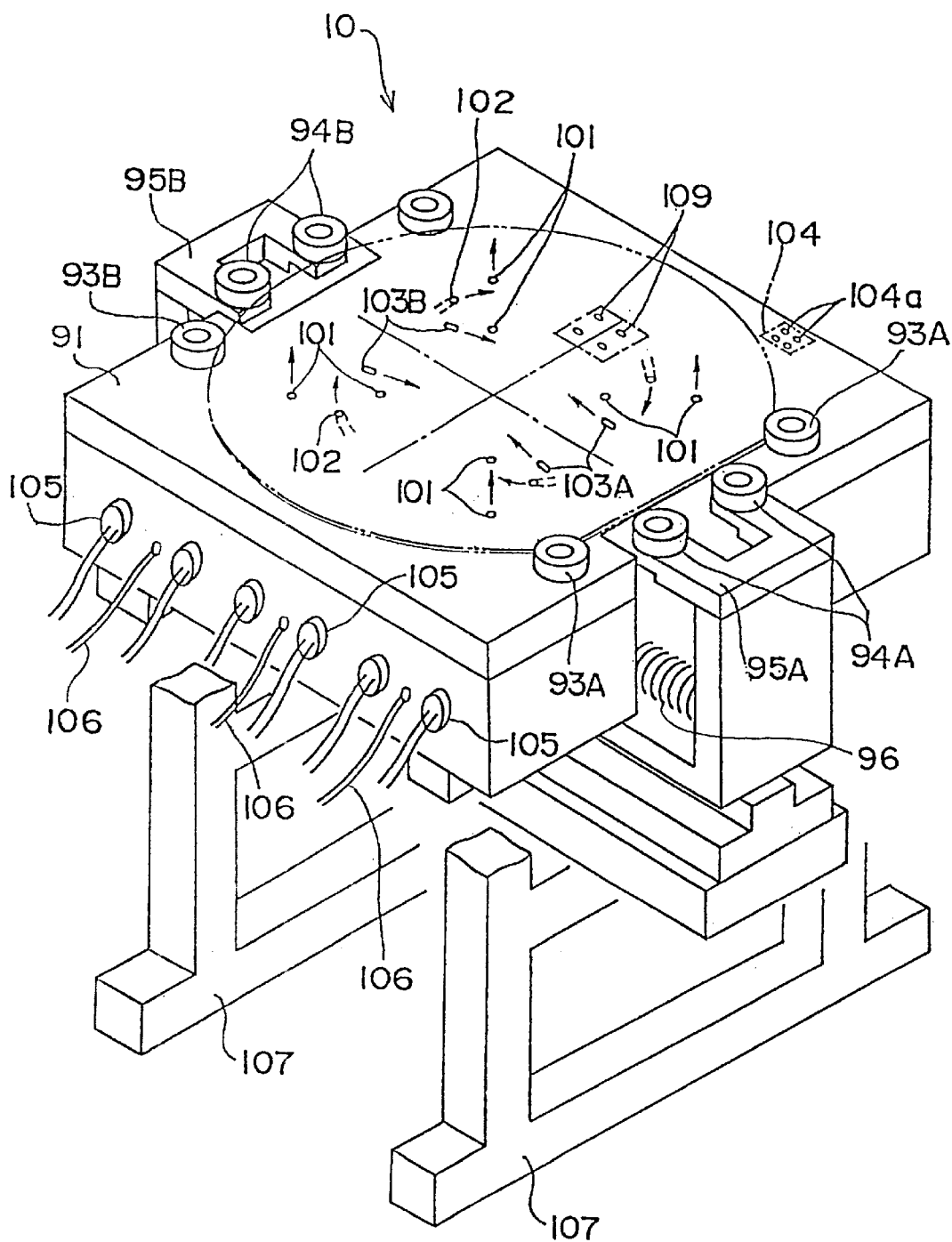
FIG. 15 is a perspective view of the bonding stage in a bump bonding apparatus as shown in FIG. 1.
Figure 16:
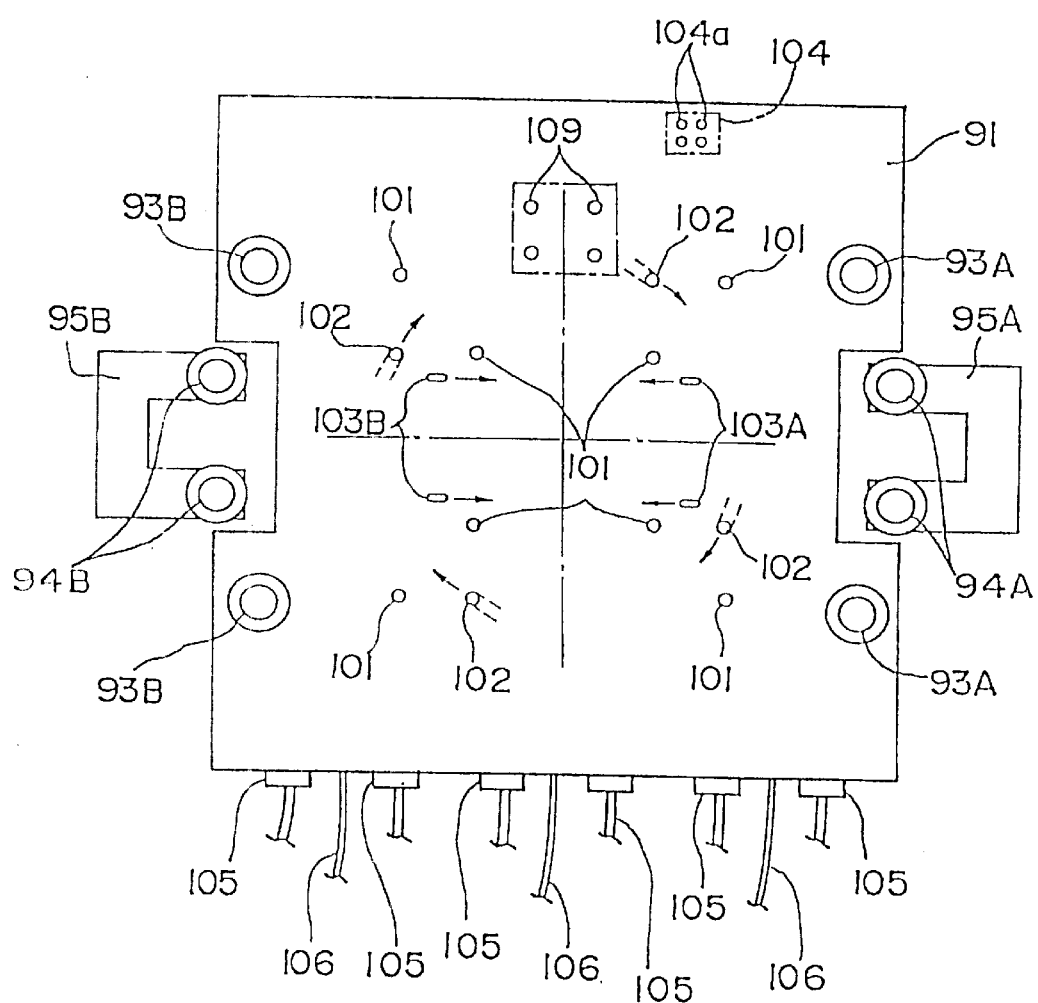
FIG. 16 is a plan view of the bonding stage shown in FIG. 15.
Figure 17:
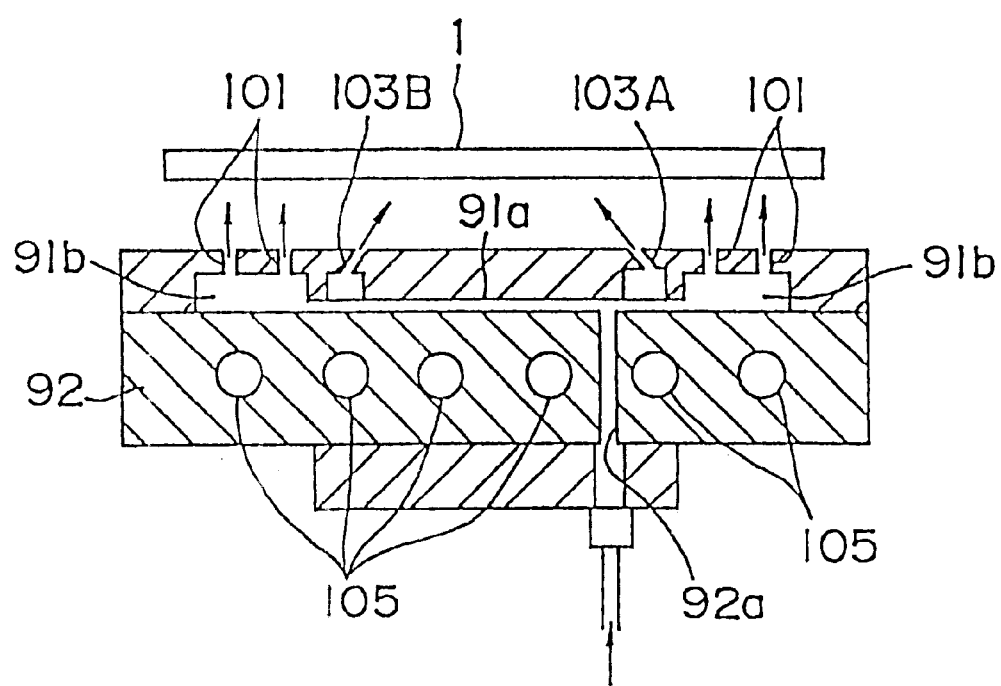
FIG. 17 is a section view of the bonding stage shown in FIG. 15.

Referring to FIG. 15 to FIG. 17, the bonding stage 10 is described. The bonding stage 10 comprises a stage plate 91 and a heat block 92 therebelow. On opposite sides of the stage plate 91 top are disposed positioning roller pairs 93A and 93B, and positioning parts 95A and 95B. Positioning roller pairs 93A and 93B are disposed with sufficient distance therebetween that a wafer 1 can be fit easily between the roller pairs. Contact rollers 94A and 94B for engaging the orientation flat from both sides of the stage plate 91 are further disposed at the positioning parts 95A and 95B. The positioning parts 95A and 95B are further disposed opposite the positioning roller pairs 93B and 93A on the respectively opposite sides of the stage plate 91. For example, positioning part 95A pushes the wafer 1 against positioning roller pair 93B to regulate wafer 1 for its position. These positioning parts 95A and 95B are normally forced by a spring 96 in the direction regulating the position of the wafer (i.e., toward the wafer). A cylinder (not shown in the figures) disposed on the back side of the stage plate 91 is used to drive the positioning parts 95A and 95B opposite the positioning direction so as to open the positioning parts 95A and 95B and release the wafer 1.

It will also be obvious that the stage plate 91 is sized appropriately to the size of the wafer 1 on which bonding bumps are to be formed.

Further disposed on the stage plate 91 are suction and flotation air outlets 101 for sucking and floating the wafer 1 above the stage plate 91; wafer turning air outlets 102 for turning a wafer 1 on the stage plate 91; and first and second positioning air outlets 103A and 103B. The wafer turning air outlets 102 are each disposed at an angle to the stage plate 91 surface such that the air stream from the air outlets is directed the same circumferential direction of the wafer 1 so as to turn the wafer 1 on the stage plate 91. The first and second positioning air outlets 103A and 103B direct an air stream in mutually opposite directions so as to push a wafer 1 against positioning roller pair 93A or 93B as the wafer is turned so that the wafer 1 does not waver. Air supply to the first and second positioning air outlets 103A and 103B is controlled with a valve which can be appropriately switched by a device not shown in the figures to direct the air stream in one direction only, that is, toward roller pair 93A or 93B.

The wafer turning air outlets 102 are disposed at a position corresponding to the edge area of the wafer 1 in order to assure reliable wafer turn. To avoid interfering with the wafer turning air stream from the turning air outlets 102, the first and second positioning air outlets 103A and 103B are disposed inside the radius of the wafer turning air stream, and the suction and flotation air outlets 101 are disposed both inside and outside this radius.

A waste bonding stage 104 with suction holes 104a for holding a waste bonding chip thereto is provided at an appropriate edge area of the stage plate 91. Wafers in which there is a crack or chip can be held for bonding by means of suction holes 109.

By means of the first and second positioning air outlets 103A and 103B, a wafer 1 being turned on the stage plate 91 can be positioned against either positioning roller pair 93A or 93B in this exemplary embodiment of the invention. The orientation flat sensors 85 on the chucking means 76 of the transporting means 9 can also move with the transporting means 9, and can therefore detect the position of the orientation flat 1a at either side of the stage plate 91.

As shown in FIG. 17, air channels 91a and 92a are disposed inside the stage plate 91 and heat block 92. Air for floating, turning, and positioning a wafer 1 is supplied through these air channels 91a and 92a to the suction and flotation air outlets 101, wafer turning air outlets 102, or the first and second positioning air outlets 103A and 103B as appropriate. An air chamber 92b linked to each of the air outlets is also disposed in the heat block 92 for storing air for supply from the outside through the air channels 91a and 92a.

By thus storing air supplied from the outside in an air chamber 92b inside the heat block 92, the air is warmed by the time it is ejected from the air outlets against the bottom of the wafer 1. The temperature gradient of air cooling the wafer 1 as a result of ejected air from the air outlets floating, turning, or positioning a wafer 1 heated on the bonding stage 10 can thus be reduced compared with the related art. It is therefore also possible to avoid the adverse effects of the cooling action of this ejected air stream on the wafer 1.

It is to be noted that six cartridge heaters 105 are further inserted parallel to each other in the heat block 92, and three thermocouples 106, one for every two cartridge heaters 105, are embedded in the heat block 92 to form three temperature control channels in the heat block 92. These temperature control channels can control temperatures to approximately 300 degrees centigrade. The heat block 92 is supported on a pair of legs 107 that are also efficient heat radiators.

It will be obvious that by providing a plurality of temperature control channels in the heat block 92, the cartridge heaters 105 can be individually controlled. As a result, the temperature of the heat block 92 can be precisely controlled according to the size of the stage plate 91, which is selected according to the size of the wafer 1 on which bumps are to be bonded.

Figure 18:
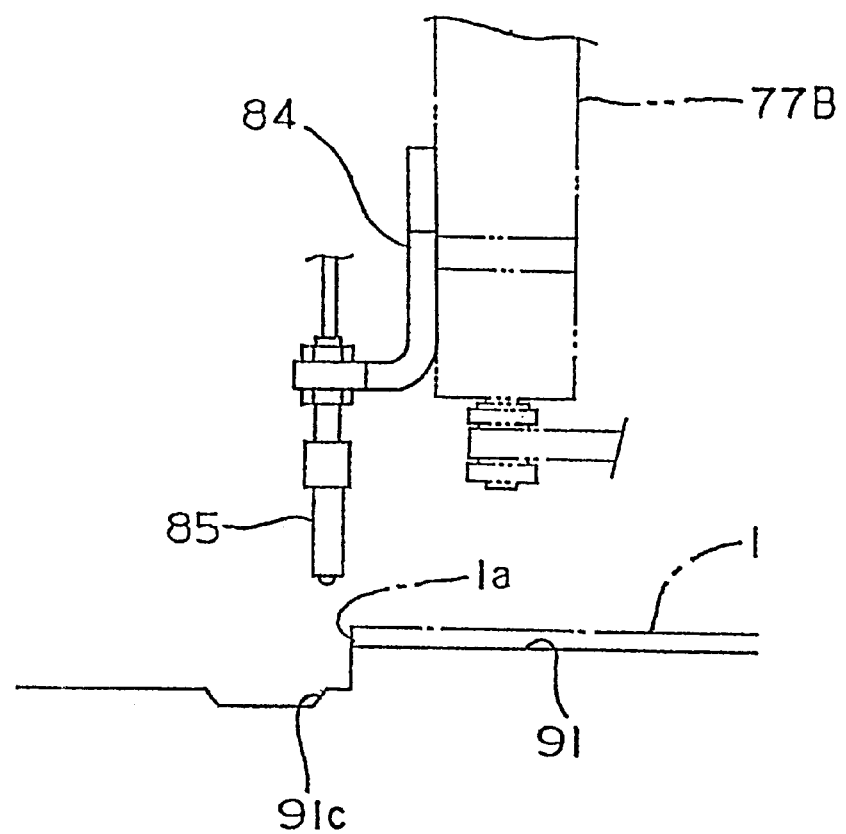
FIG. 18 is a descriptive view of the detecting means of the chuck positioned at an edge of the bonding stage shown in FIG. 15.

When a wafer 1 is transported onto this bonding stage 10 by the transporting means 9, the position of the wafer orientation flat 1a is first detected using the two sensors 85 disposed in a middle part of the one finger 77B in the transporting means 9. It should be further noted that beveled faces having a specific slope are formed in the top of the stage plate 91 at and near the edge of the stage plate 91 in this preferred embodiment of the invention. As shown in FIG. 18, after placing a wafer 1 on the bonding stage 10, the transporting means 9 is positioned so that the above-noted orientation flat sensors 85 are positioned directly above slope 91c formed at the edge of the stage plate 91. Note that the two sensors 85 are disposed in a direction perpendicular to the direction of travel of the transporting means 9.

The detecting operation whereby the position of the orientation flat 1a is detected using these two sensors 85 from above the wafer 1, that is, from above the bonding stage for various states of the wafer 1, is the same as the operation whereby the orientation of the wafer is detected using the two orientation flat sensors 56 at the loading station 2 as described above with reference to FIG. 8. That is, when a part of the wafer 1 is directly below either of the sensors 85, the light beam from the light emitting element of the sensor 85 is reflected in the same direction as that in which it was incident to the surface of the wafer 1, and the orientation flat 1a can thus be detected as being incorrectly positioned. When the wafer 1 is extracted from both of the sensors 85, the orientation flat 1a can be detected as being correctly positioned. It is to be noted that the light from the light emitting element is reflected to the outside by slope 91c.

The angle of slope 91c from which a light beam from the sensors 85 is reflected can be any angle whereby the reflected light is not incident upon the reflective object, such as chucking means 76 or other objects around it. Reflection of the emitted light beam from slopes 91c with different angles is described more fully below with reference to 19A to 19C.

Figure 19A:
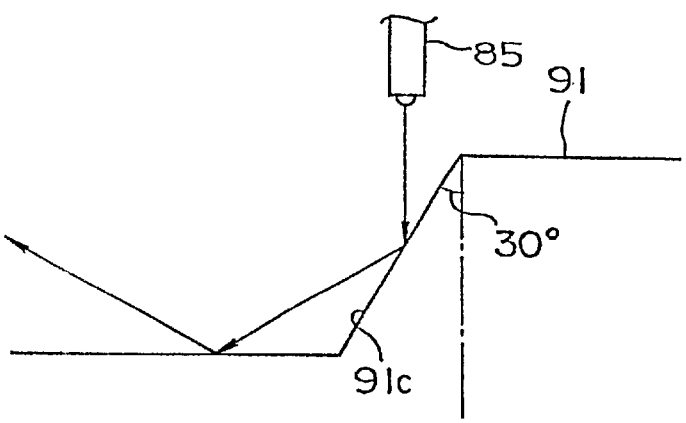
FIG. 19A to FIG. 19C are descriptive views of the reflection of an optical detection beam reflected from various slopes at and near the edge of the bonding stage shown in FIG. 15, FIG. 19A showing a slope of 30 degrees to a vertical plane, FIG. 19B showing a slope of 45 degrees to a vertical plane, and FIG. 19B showing a slope of 60 degrees to a vertical plane.

FIG. 19A shows a slope 91c with an angle of 30 degrees to the vertical. Light from a sensor 85 is first reflected by this slope 91a to the surface of the bonding stage 10, and is reflected to the outside away from the sensor 85 by the bonding stage 10. As a result, the reflected light is not incident upon the sensor 85.

Figure 19B:
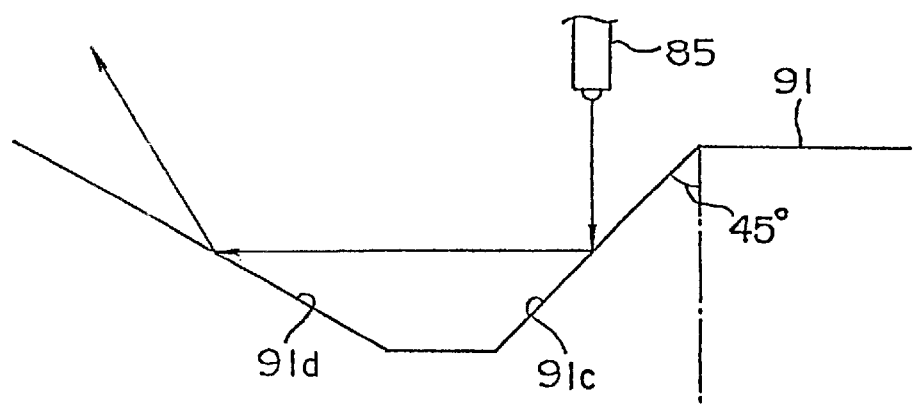

FIG. 19B shows a slope 91c with an angle of 45 degrees to the vertical. Note that there is a further slope 91d opposite the first slope 91c. In this case, light from a sensor 85 is first reflected by this slope 91c to the opposite slope 91d, and is reflected by this second slope 91d to the outside away from the sensor 85. As a result, the reflected light is not incident upon the sensor 85.

Figure 19C:
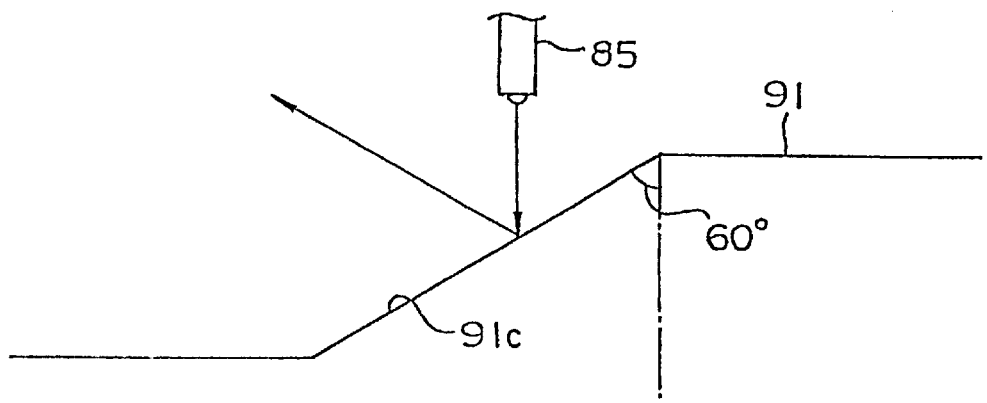
Figure 20:
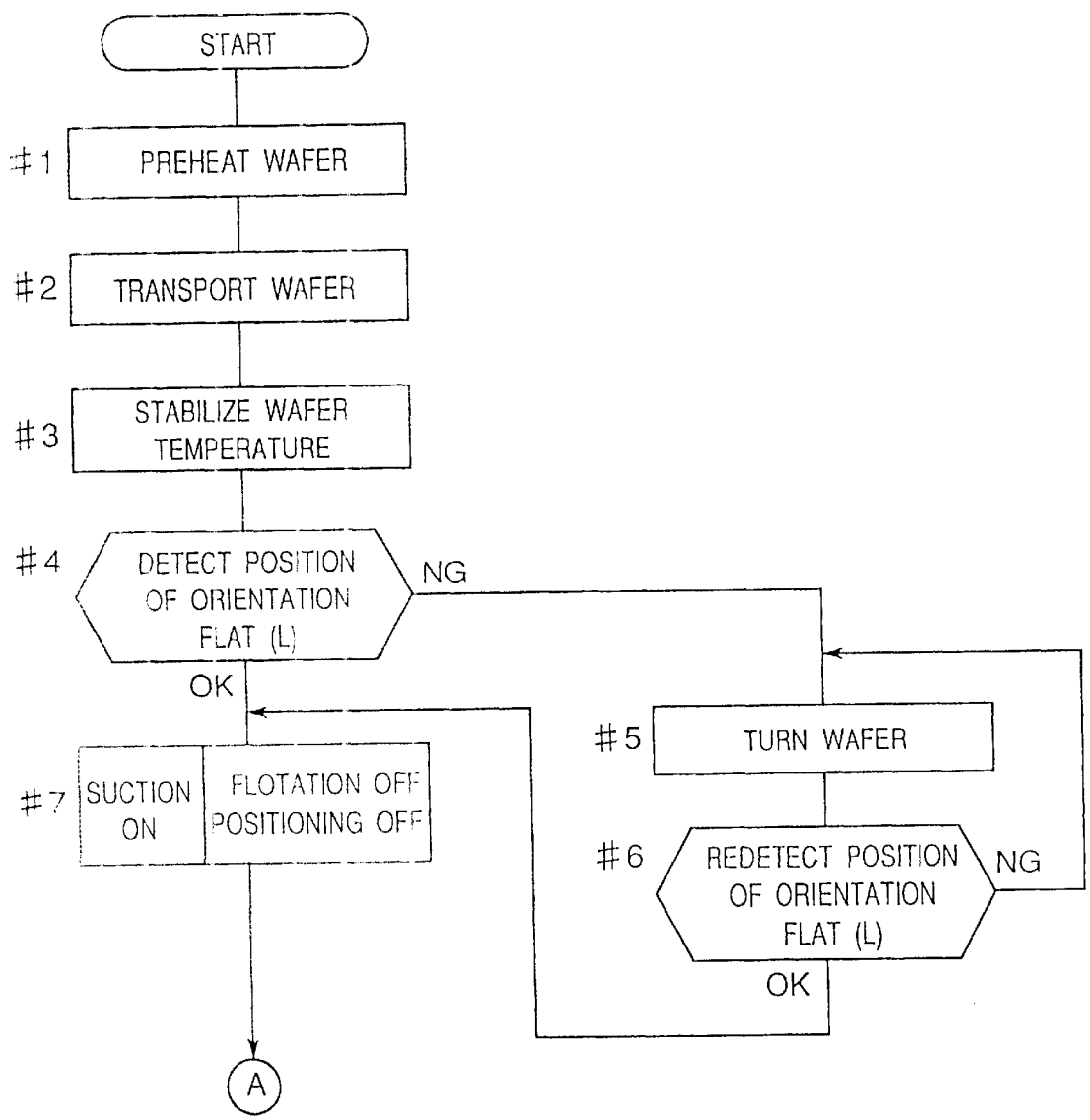
FIG. 20 is a first flow chart of the bump bonding process for bonding bumps on each IC chip on a wafer according to a bump bonding apparatus.
Figure 21:
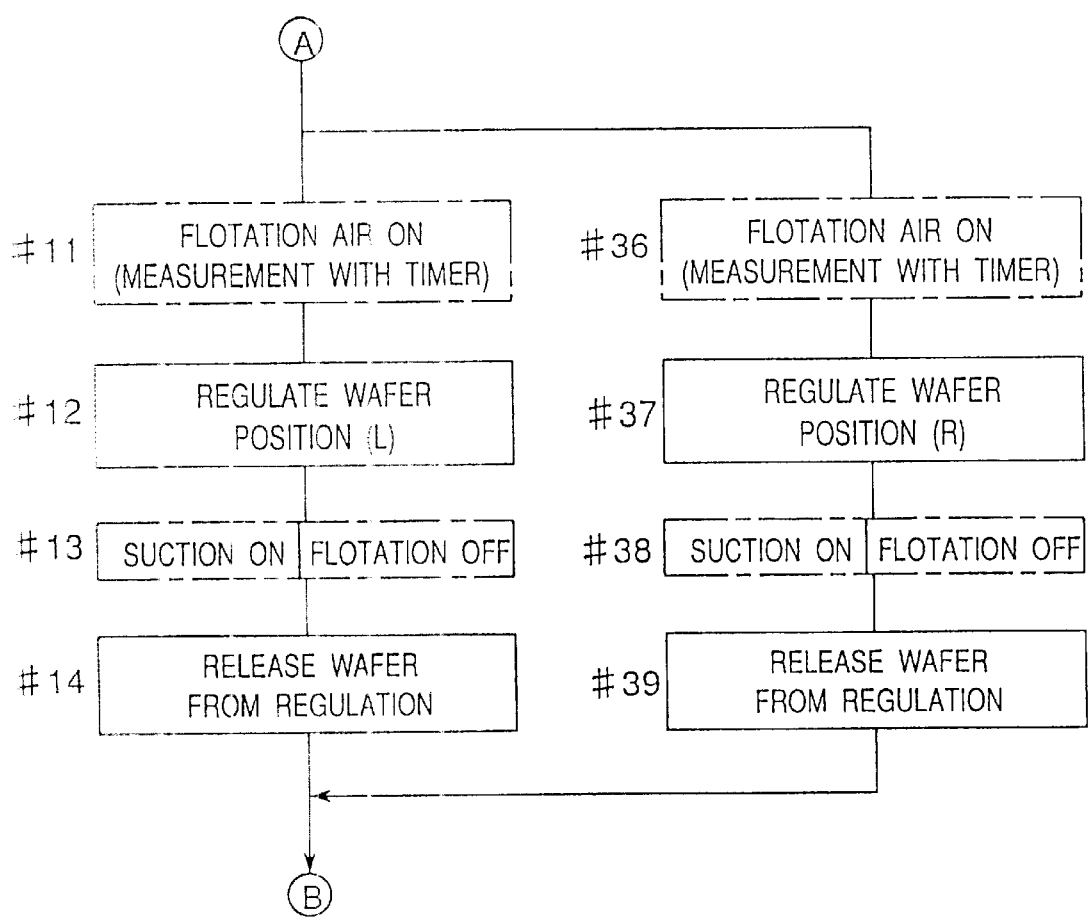
FIG. 21 is a second flow chart of the bump bonding process shown in FIG. 20.
Figure 22:
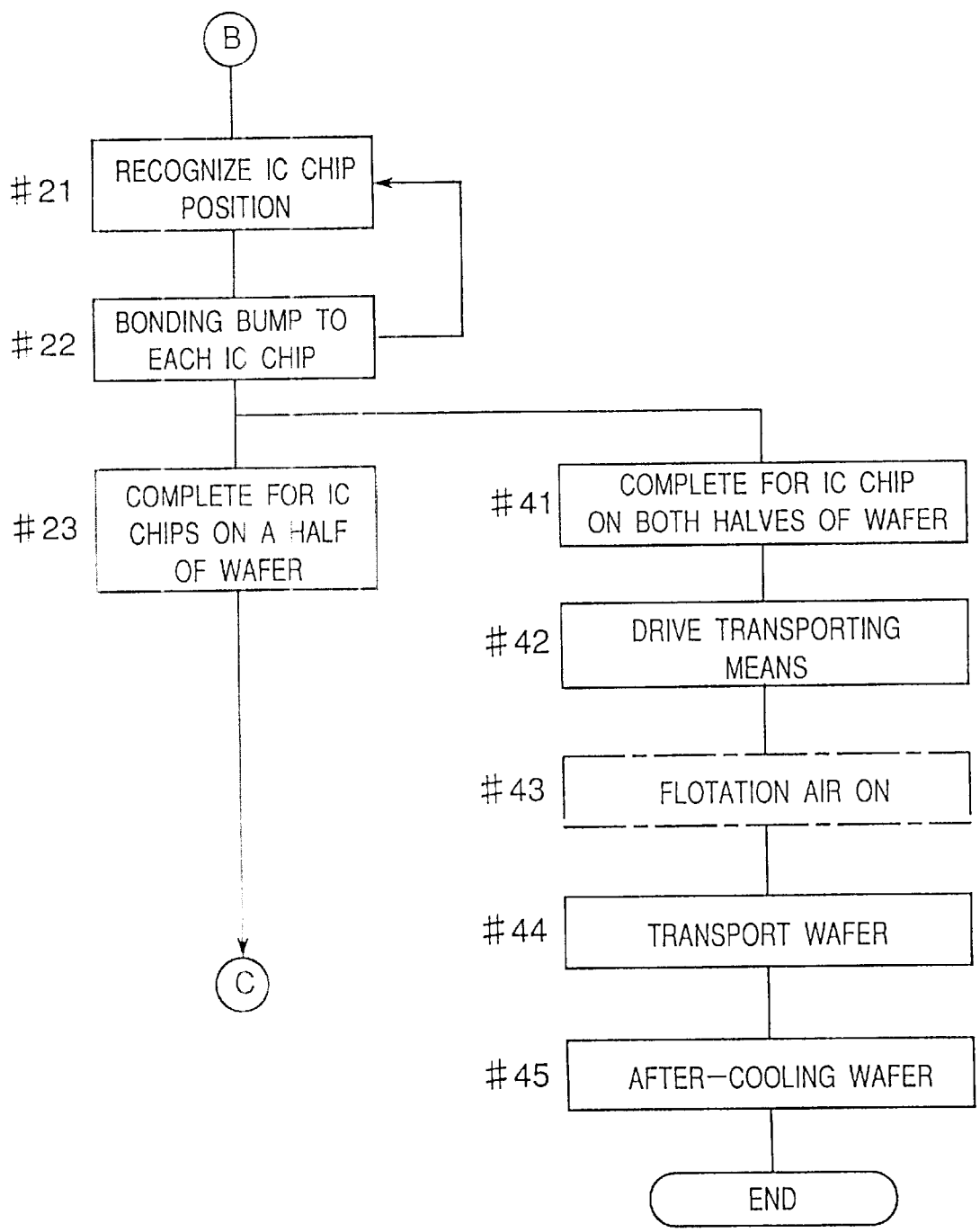
FIG. 22 is a third flow chart of the bump bonding process shown in FIG. 20.
Figure 23:
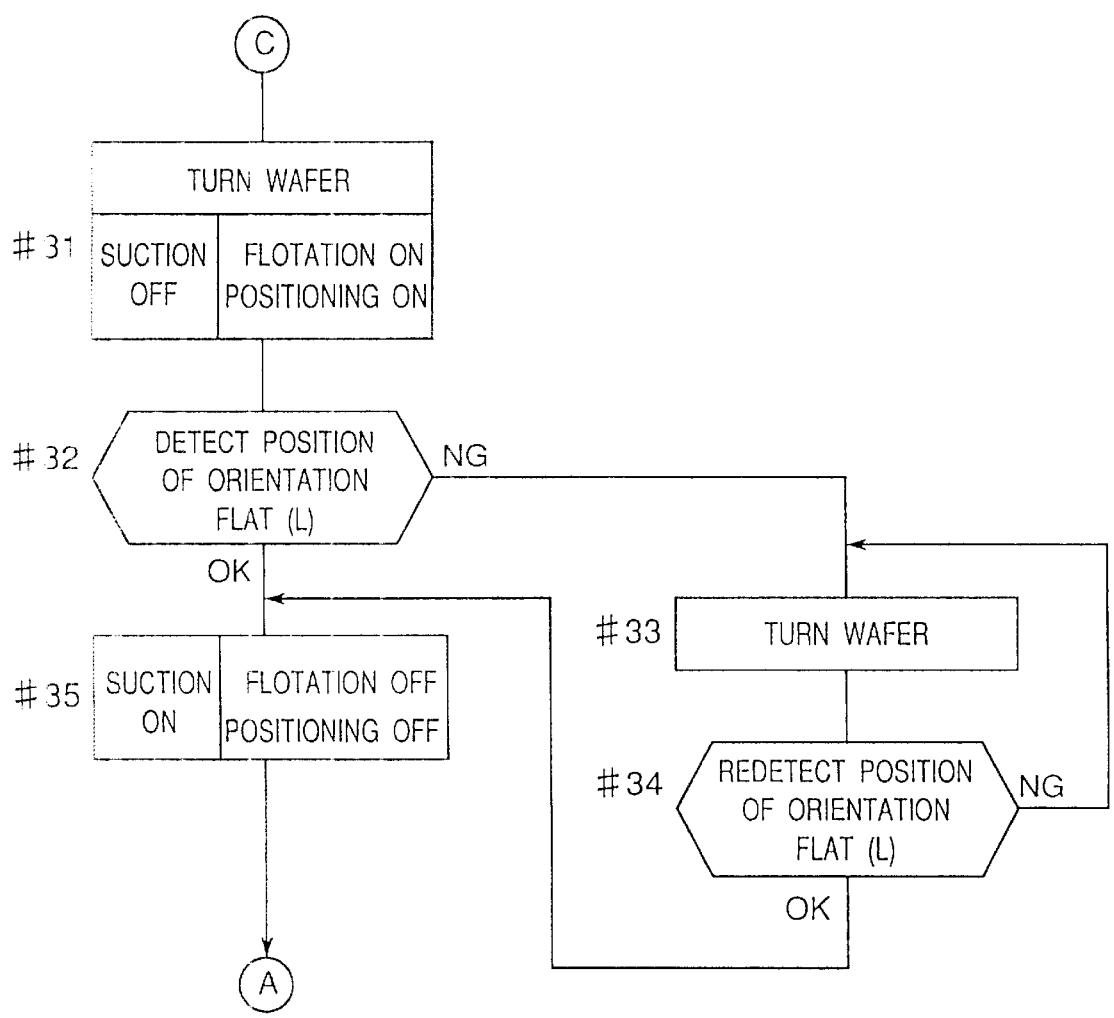
FIG. 23 is a fourth flow chart of the bump bonding process shown in FIG. 20.

FIG. 19C shows a slope 91c with an angle of 60 degrees to the vertical. In this case light from a sensor 85 is directly reflected to the outside away from the sensor 85 by this slope 91d, and as a result is not incident upon the sensor 85.

By thus providing a slope 91c with a specific angle in the top at and near the edge of the stage plate 91, the light beam emitted from the sensors 85 for detecting the position of an orientation flat 1a from above the wafer 1 is reflected in different directions when the orientation flat 1a is desirably positioned and when it is not desirably positioned. That is, when the orientation flat 1a of the wafer 1 is not desirably positioned, the detection beam is reflected by the slope 91c away from the sensor 85. When the orientation flat 1a of the wafer 1 is desirably positioned, the detection beam is not reflected by the slope 9 c and is thus reflected in a different direction, i.e., the detection beam is reflected by the top surface of the bonding stage 10 and is thus incident to the sensor 85. There is thus no interference with detecting the position of the orientation flat 1a.

In a bump bonding process using this bonding stage 10, the wafer 1 is first moved to the inside of the opposing positioning roller pairs 93A and 93B by the transporting means 9. The positioning part 95B on the left side as seen in the figures then operates, causing its contact rollers 94B to engage the orientation flat 1a and push the wafer 1 to the right against the opposing positioning roller pair 93A. An air stream is also ejected from the first positioning air outlets 103A at this time to help keep the wafer 1 engaged with positioning roller pair 93B. At this time, the wafer 1 is thus desirably positioned by contact rollers 94B and positioning roller pair 93A. The wafer 1 is then fixed in place by means of suction pressure using suction and flotation air outlets 101, and bumps are formed on the IC chips in half of the wafer 1.

The suction pressure and left-side positioning part 95B holding the wafer 1 on the bonding stage are then released, the wafer 1 is floated by blowing air out from suction and flotation air outlets 101 against the bottom of the wafer 1, a further air stream is blown from the second positioning air outlets 103B to engage the wafer 1 with the right-side positioning roller pair 93A, and the wafer 1 is turned against the positioning roller pair 93A by ejecting an air stream at a specific flow rate from the turning air outlets 102. It is to be noted that by engaging the wafer I with the positioning roller pair 93A as it is turned, the wafer 1 can be stably turned in a fixed position without the wafer wavering.

While the wafer 1 is being turned, the transporting means 9 is moved so that the sensors 85 are directly above the slope 91c provided around the outside edge on the right side of the stage plate 91. When the wafer 1 is turned one half turn and the orientation flat 1a is positioned opposite the right-side positioning part 95A, the orientation flat 1a will be detected by the sensors 85 as described above. The air streams floating and turning the wafer 1 are then stopped immediately.

It should be noted that by detecting the orientation flat 1a at two points, the position of the orientation flat 1a can be detected with high precision irrespective of the rate at which the wafer 1 is turned.

It is also possible to reliably detect undesirable turning and positioning of the wafer 1, such as over-turn, by moving the sensors-85 to a position at which over-turn of the orientation flat 1a can be detected. This is possible because the sensors 85 can move above the bonding stage 10 in conjunction with movement of the transporting means 9.

It should be further noted that when this apparatus is used with relatively small, lightweight wafers, such as a wafer 3 inches in diameter, wafer turn tends to be unstable at the beginning of wafer flotation and turn. In this case, detection for orientation flat 1a is preferably performed later, that is, after wafer turn is stabilized.

The positioning part 95A on the right side as seen in the figures then operates, causing its contact rollers 94A to engage the orientation flat 1a and push the wafer 1 to the left against the opposing positioning roller pair 93B. The wafer 1 is thus desirably positioned by contact rollers 94A and positioning roller pair 93B at this time. The wafer 1 is then fixed in place by means of suction pressure using suction and flotation air outlets 101, and bumps are formed on the IC chips in the half of the wafer 1 that is now closest to the bonding head 11, thus completing bump formation to all IC chips on the wafer 1.

By thus effectively dividing the wafer 1 into two halves, forming bumps at one half, then turning the wafer and forming bumps at the other half, the range of bonding head 11 movement is smaller, the rigidity and dimensional precision of the bonding head 11 can be assured, and thus high precision bump formation is possible.

The process for bonding bumps to IC chips on a wafer in a bump bonding apparatus according to the present invention is described next below with reference to the flow charts in FIG. 20 to FIG. 23.

When the bump bonding apparatus is driven and the system starts, the wafer is first preheated (step #1). The wafer 1 is heated to above approximately 150 degrees centigrade (in some cases to approximately 300 degrees centigrade) at the bonding stage 10, and this preheating step prevents such problems as wafer cracking that can result from sudden rapid heating. Preheating can be accomplished by various methods. For example, the wafer 1 can be preheated in a separate preheating station (not shown in the figures) located between where the wafer 1 is extracted from the carrier 30 and the bonding stage 10. Alternatively, the wafer 1 can be preheated in a separate preheating station before extracting the wafer 1 from the carrier 30, and then be reinserted to the carrier 30. The preheating conditions are appropriately set according to the heating temperature and conditions of the bonding stage 10.

After preheating to a particular temperature, the wafer 1 is transported onto the bonding stage 10 by the transporting means 9 (step #2). As described above, the wafer 1 is held and transported by a 6-point chucking means 76 after being previously positioned in a particular direction. The wafer 1 is then held on the bonding stage 10 for a specific period of time to stabilize the wafer temperature (step #3). This corrects any overall distortion, that is, heat-induced warping, of the wafer 1 caused by preheating.

The orientation flat of the wafer is then detected for its position (step #4). At this time, the wafer 1 is floated as it is shifted to either the right or left side (the left side (L) in this exemplary embodiment) by the appropriate positioning air stream while the orientation flat is oriented.

If it is detected that the position of the orientation flat is acceptable (OK) in step #4, the wafer flotation and positioning air streams are both turned off, and the wafer 1 is secured on the bonding stage 10 surface by means of suction (step #7).

If it is detected that the position of the orientation flat is not acceptable (NG) in step #4, the wafer 1 is turned by the turn air stream (step #5) and the orientation of the orientation flat is detected again after wafer turn stops (step #6). This loop of steps #5 and #6 continues until it is determined that the orientation flat is desirably positioned in step #6. When step #6 thus returns OK, the wafer 1 is secured on the bonding stage 10 by means of suction (step #7).

After detecting the orientation flat of the wafer on the bonding stage 10, the position of the wafer is regulated. As described above, the left-side positioning part 95 in this example is driven to engage the contact rollers 94 thereof with the orientation flat 1a and push the wafer 1 against the opposing (right-side) positioning roller pair 93, thereby regulating the position of the wafer 1 between the contact rollers 94 and positioning roller pair 93 (step #12). After thus positioning the wafer 1, as long as the wafer is kept secured onto the surface of the bonding stage 10 with suction pressure as described above, the members for positioning the wafer 1, that is, positioning roller pair 93 and contact rollers 94, are disengaged from the wafer 1 (step #14).

It is to be noted that when the surface roughness on the back of the wafer exceeds a particular level, such as with quartz or lithium tantalate (LiTa) wafers, the coefficient of friction on the back of the wafer against the surface of the bonding stage is high, and the wafer does not slide easily. This may make it difficult to smoothly position and secure the wafer. This problem can be overcome by floating the wafer on flotation air (step #11) before securing the wafer in position (step #12). To float the wafer reliably, a timer is preferably used to supply the wafer flotation air stream for a predetermined time. With the wafer floated its position is regulated. After regulating the position of the wafer, the flotation stream is turned off, and the wafer is secured by suction onto the bonding stage.

After positioning of the wafer is thus completed, bumps are formed at the electrode part of IC chips on the wafer in a bonding process described next below.

In this bonding process, repeating recognition for IC chip position, each bump is formed (step #21 and #22). After bonding bumps to all IC chips on a first half of the wafer 1 is completed (step #23), the wafer 1 is then turned (reversed) by turning the suction off, and turning flotation, positioning, and turn air streams on (step #31). After turning the wafer, the position of the orientation flat is detected and the wafer 1 is again secured in position as described above (steps #32 to #35). Note that this operation is identical to that described above in steps #4 to #7, and the same operations are performed in corresponding steps except that right and left are reversed.

After completing step #35, the position of the wafer 1 is again regulated (steps #36 to #39). Note that this operation is likewise identical to that described above in steps #11 to #14, and the same operations are performed in corresponding steps except that right and left are reversed. Then, bump bonding is performed to the remaining second half of the wafer (step #21 and #22).

When bump bonding to all IC chips on this second half of the wafer 1 is completed, and bump bonding to all IC chips on the wafer is thus completed (step #41), the transporting means 9 is again driven (step #42) to transport the wafer 1 from the bonding stage 10 (step #44). Note that if the surface roughness on the back of the wafer exceeds a particular level, such as with quartz or lithium tantalate (LiTa) wafers, so that the coefficient of friction on the back of the wafer against the surface of the bonding stage prevents the wafer from sliding easily, the wafer is first floated on flotation air (step #43) before transporting it from the bonding stage 10.

The wafer 1 is then gradually cooled in an after-cooling process (step #45) maintaining a predetermined maximum temperature gradient to prevent the wafer 1, which has been heated to a high temperature in the bonding stage 10, from cooling too rapidly. This after-cooling process can reliably prevent cracking and other problems resulting from sudden cooling of the wafer 1.

It will thus be obvious that bumps are formed to each electrode of every IC chip on the wafer surface in a bump bonding apparatus according to the present invention by dividing the wafer 1 effectively into approximate halves, forming bumps on the electrode of IC chips on one half, and then turning the wafer to form bumps on the electrode part of IC chips on the other half.

The process of supplying air for turning the wafer in steps #5, #31, and #33 in the above flow charts is described more fully below with reference to the flow charts in FIG. 24 to FIG. 26.

Figure 24:
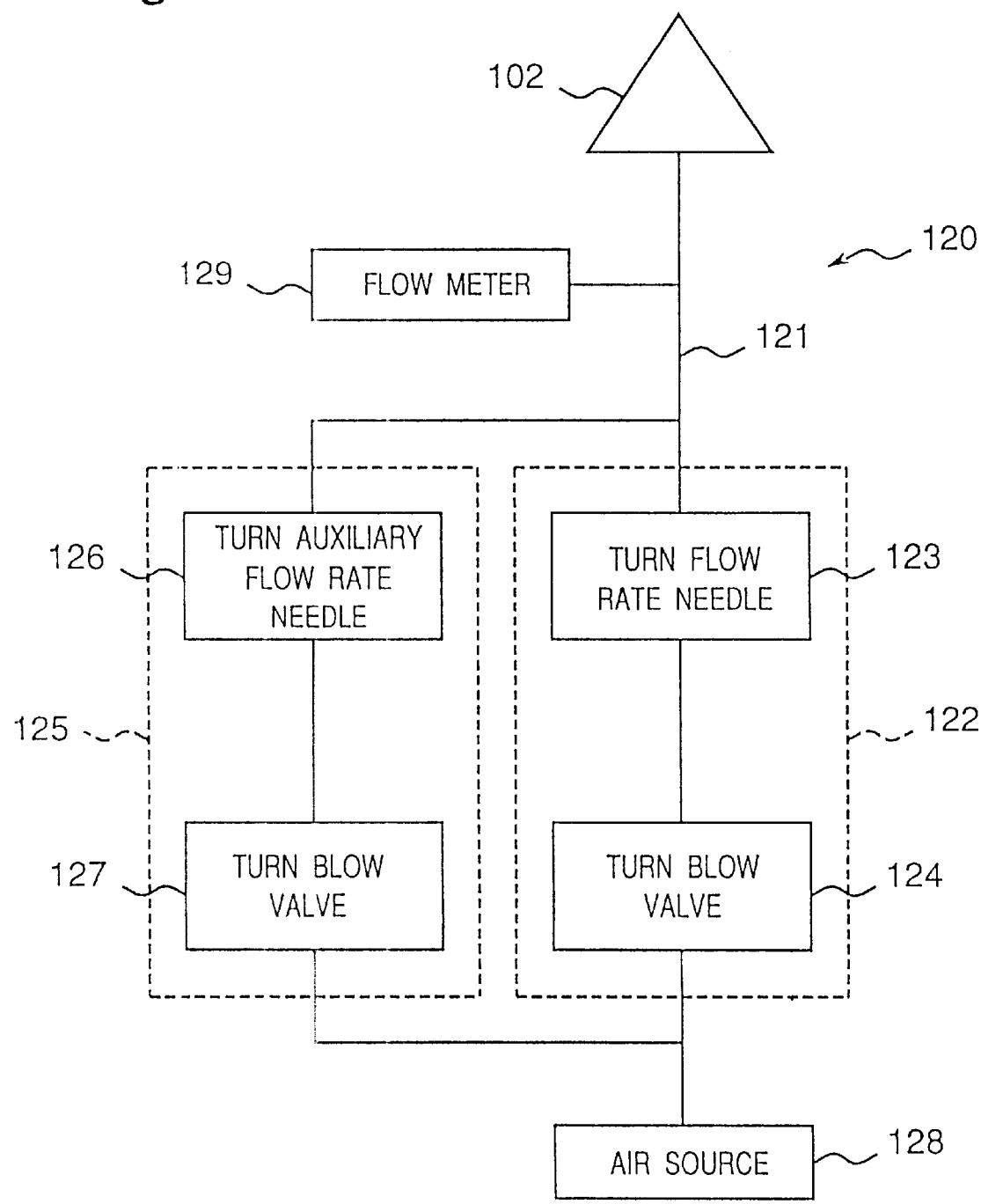
FIG. 24 is a block diagram of an air blower for wafer turn at the bonding stage.

FIG. 24 shows the basic configuration of an air blowing means 120 for wafer turn in an exemplary embodiment of the present invention. This turn air blowing means 120 comprises turn air outlets 102, an air supply path 121, a turn air supplying means 122, a turn auxiliary supplying means 125, and an air source 128.

The turn air outlets 102 are disposed on substantially the same circumference on the bonding stage 10 so that the air ejected therefrom causes the wafer 1 to turn.

One end of the air supply path 121 is linked to the turn air outlets 102; the other end branches to the turn air supplying means 122 and turn auxiliary supplying means 125. The turn auxiliary supplying means 125 can be driven in addition to the turn air supplying means 122. The air source 128 supplies air to both the turn air supplying means 122 and the turn auxiliary supplying means 125.

The turn air supplying means 122 comprises a turn flow rate needle 123 for passing air in a predetermined flow rate for turning the wafer 1, and a turn blow valve 124 for opening and closing to control the air supply from the air source 128 to the turn flow rate needle 123. Similarly to the air supplying means 122, the auxiliary supplying means 125 comprises a turn auxiliary flow rate needle 126 for passing air in a predetermined flow rate for turning the wafer 1, and a turn blow valve 127 for opening and shutting to control the air supply from the air source 128 to the turn auxiliary flow rate needle 126. The turn blow valves 124 and 127 of the air supplying means 122 and 125 can be opened and shut at a desired timing. A flow meter 129 for measuring the total air flow supplied from the air supply means 122 and 125 is further disposed at the supply channel 121.

The flow rate of the air ejected from the air outlets 102 can be controlled with a turn air blowing means 120 thus comprised by changing the open and shut pattern of the turn blow valves 124 and 127 in the turn air supplying means 122 and 125. For example, by opening the turn blow valve 124 in the air supply means 122 and closing the turn blow valve 127 in the auxiliary supply means 125, an air stream at the flow rate of only the turn flow rate needle 123 will be ejected from the turn air outlets 102.

If the turn blow valve 127 of the auxiliary then opened, the auxiliary air stream at a flow rate regulated by needle 126 will be added to the air stream in the supply channel 121, and an air stream at the combined flow rates of both air supply means 122 and 125 will be passed from the wafer turn air outlets 102.

Figure 25:
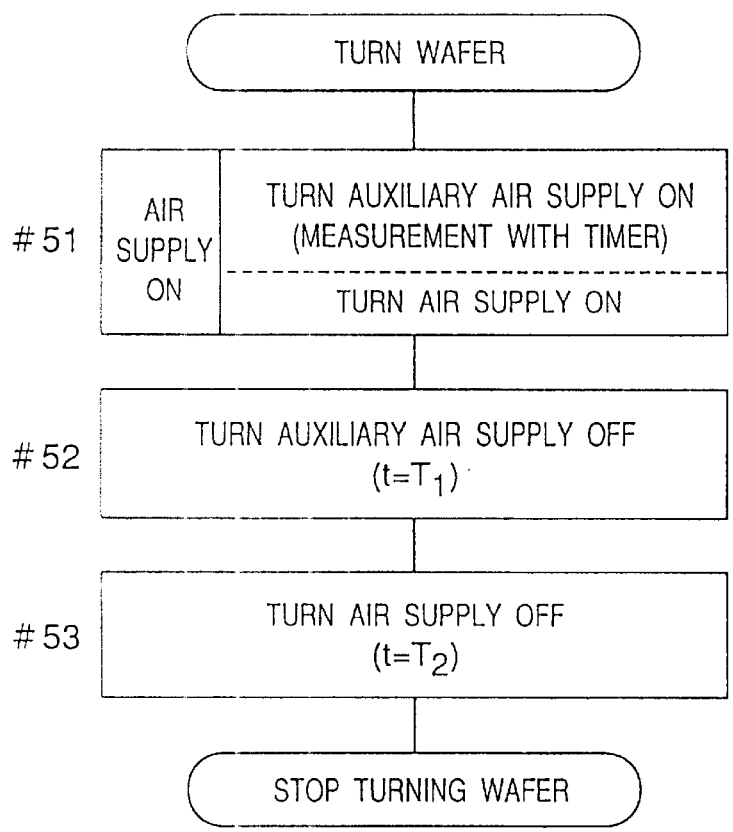
FIG. 25 is a flow chart of the process for supplying air when turning a wafer on the bonding stage.
Figure 26:
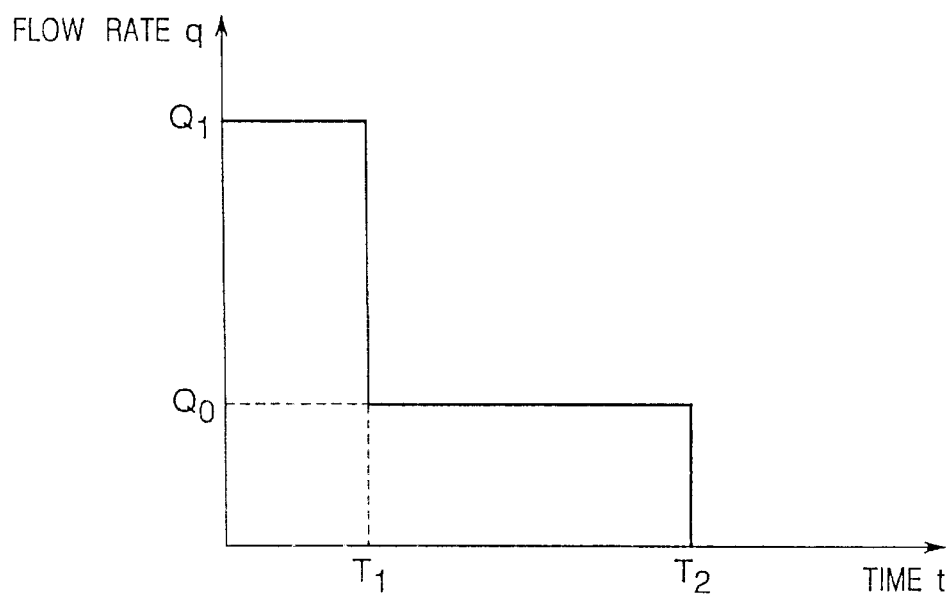
FIG. 26 is a graph showing the change in air flow for the turning air supply process shown in FIG. 25.

FIG. 25 is a flow chart of the air supply process using a blower 120 according to this preferred embodiment of the invention, and FIG. 26 is a graph showing the change in air flow achieved by this process.

To start wafer turn, the turn blow valves 124 and 127 of both air supply means 122 and 125 are opened to supply both the primary and auxiliary air streams to the air outlets 102 with a total air flow $Q_1$ (see FIG. 26) released from the air outlets 102 on the top surface of the bonding stage 10 (step #51). The flow rates of the primary and auxiliary air streams are preferably 3.3 to 3.4 liters per minute, and 9 liters per minute. This strong air flow is sufficient to smoothly start wafer turn even with large, heavy wafers or quartz, lithium tantalate, or other wafers with a surface roughness on the back exceeding a specific level (10 to 80 $\mu$m). It is to be noted that a timer is used to supply the auxiliary air stream for a specific time $T_1$ only, typically 0.3 to 0.8 second.

After the timer counts to this time $t=T_1$, the turn blow valve 127 of the auxiliary supply means 125 is closed to turn the auxiliary air stream off (step #52). Air flow from the air outlets 102 is thus reduced to a level $Q_0$ sufficient only to maintain wafer turn. When time $t=T_2$ then passes, the turn blow valve 124 of the primary air supply means 122 is also closed to stop the flow of air from the turn air outlets 102 (step #53). The wafer 1 thus gradually loses speed and stops on the bonding stage 10.

It is therefore possible with a wafer-turning air blower 120 according to this preferred embodiment of the invention to smoothly start wafer turn regardless of wafer material, weight, and size by using a powerful air stream, and then reduce the air flow once the wafer is turning to maintain stable wafer turn. It is also possible to change the strength of the air stream on the turning wafer 1 when both primary and auxiliary air streams are flowing by turning the auxiliary air supply off, and thereby change smoothly from fast wafer turn to slow wafer turn without stopping the air supply.

Figure 27:
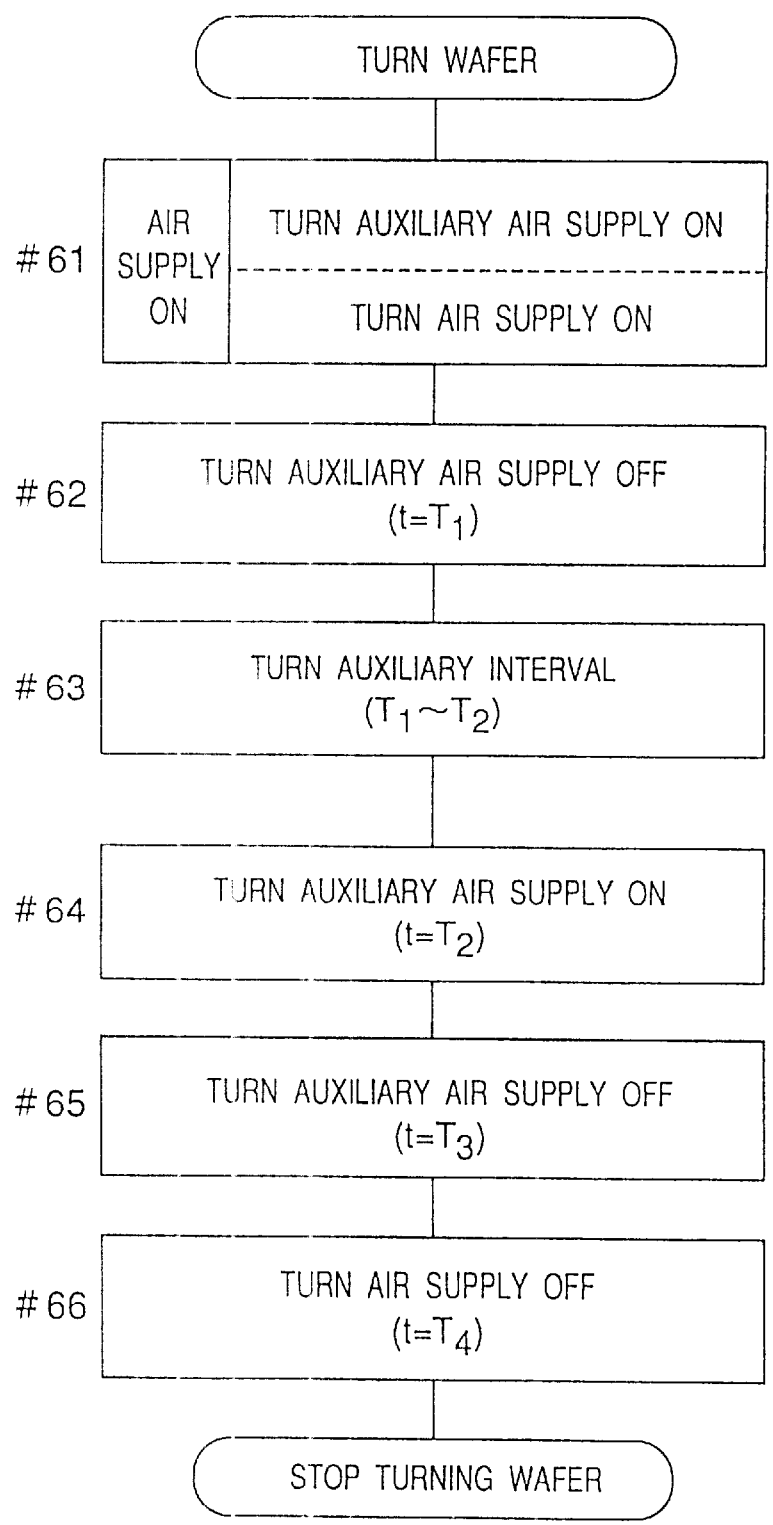
FIG. 27 is a flow chart of an air supply process for supplying air when turning a wafer on the bonding stage according to another preferred embodiment of the present invention.
Figure 28:
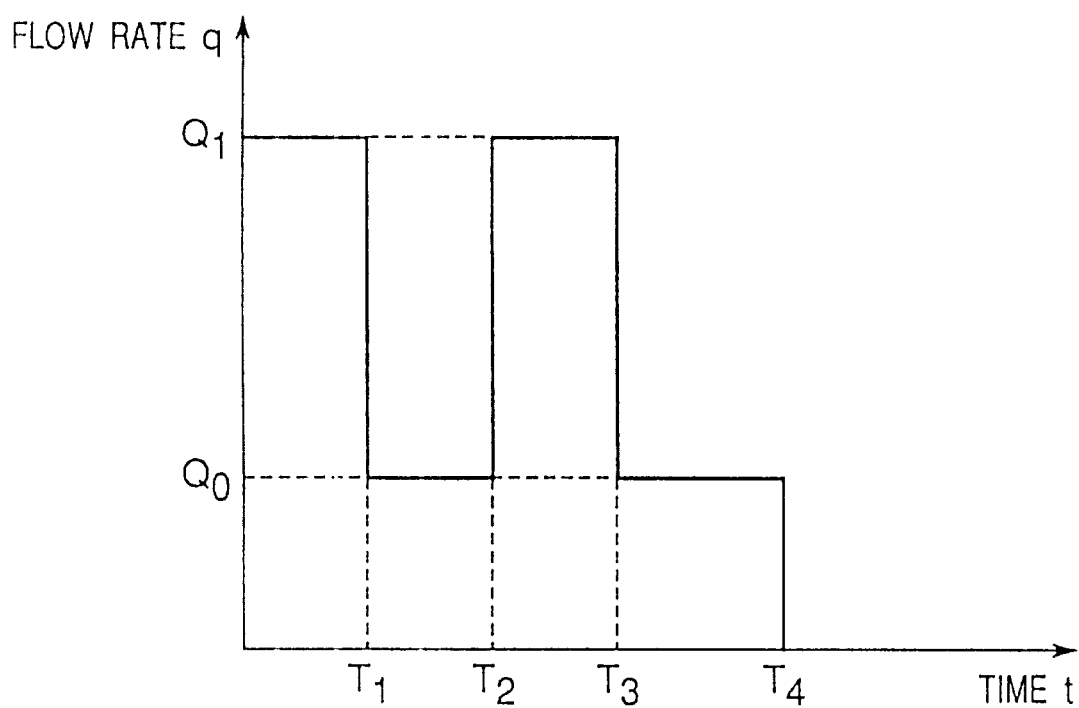
FIG. 28 is a graph showing the change in air flow for the air supply process shown in FIG. 27.

An air supply process for wafer turn according to an alternative embodiment of the present invention is described next with reference to FIG. 27 and FIG. 28. FIG. 27 is a flow chart of this air supply process, and FIG. 28 is a graph showing the change in air flow achieved by this process. The configuration of the turn air blower used in this air supply process is identical to that used in the above process and shown in FIG. 24. Further description thereof is thus omitted below.

To start wafer turn, the turn blow valves 124 and 127 of both air supply means 122 and 125 are opened to supply both the primary and auxiliary air streams to the air outlets 102 with a total air flow $Q_1$ (see FIG. 28) released from the air outlets 102 on the top surface of the bonding stage 10 (step #61). This strong air flow is sufficient to smoothly start wafer turn even with large, heavy wafers or quartz, lithium tantalate, or other wafers with a surface roughness on the back exceeding a particular level (10 to 80 $\mu$m).

After the timer counts to time $t=T_1$, the turn blow valve 127 of the auxiliary supply means 125 is closed so as to turn the auxiliary air stream off (step #62). Air flow from the air outlets 102 is thus reduced to a level $Q_0$ sufficient only to maintain wafer turn. This air flow is maintained for a specific time ($T_1$ to $T_2$) (step 463). The turn blow valve 127 for the auxiliary supply means 125 is then reopened to again supply the combined total air flow $Q_1$ from the air supply means 122 and 125 to the air outlets 102 (step #64). It is to be noted that to achieve an even more stable wafer turn, the air flow set by the needle 126 of the auxiliary supply means 125 can be changed to supply air in step #64 at a different rate than is supplied in step #61.

After time $t=T_3$ the turn blow valve 127 of the auxiliary supply means 125 is again closed to turn the auxiliary air stream off (step #65), thus reducing the air flow to a level $Q_0$ sufficient only to maintain wafer turn.

When time $t=T_4$, the turn blow valve 124 of the primary air supply means 122 is also closed to stop the flow of air from the turn air outlets 102 (step #66). The wafer 1 thus gradually loses speed and stops on the bonding stage 10.

Low speed wafer turn is preferable as a means of assuring precise orientation flat detection, but when the surface roughness of the wafer back exceeds a particular level, typically 10 to 80 $\mu$m, as with the above-noted quartz and LiTa wafers, the wafer may stop turning before it reaches the orientation flat detection position when the wafer is turning at low speed. With the method according to this alternative embodiment, however, such wafers can be stably turned at low speed by intermittently supplying the auxiliary air, that is, turning the auxiliary supply means 125 on again while the wafer is turning after once turning it off, once wafer turn has started. It should be further noted that this intermittent air supply can be repeated a plurality of times. For example, large, heavy wafers such as a 12-inch wafer requires a relatively long time to turn, but the required time can be shortened by intermittently supplying the auxiliary air a plurality of times.

Figure 29:
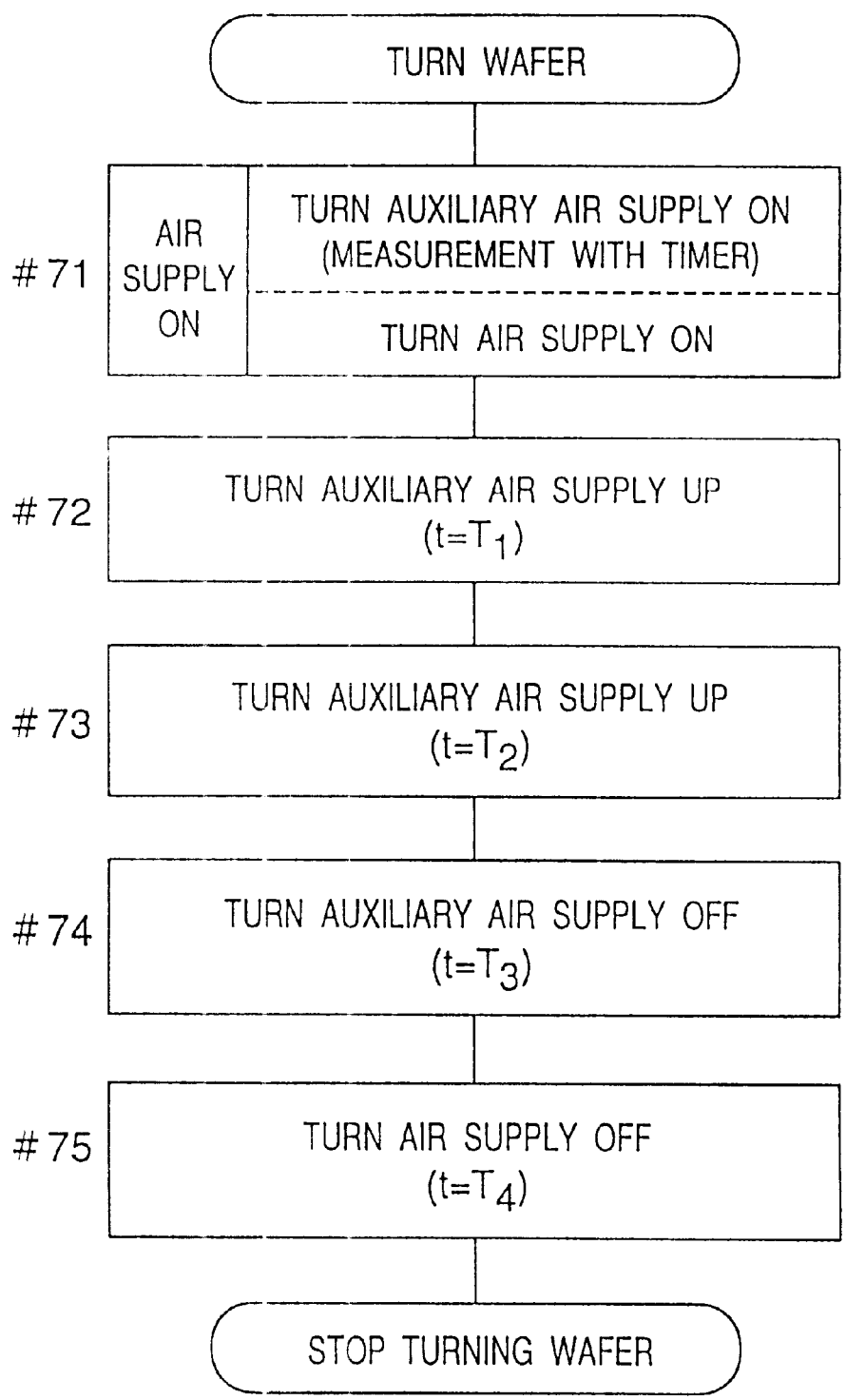
FIG. 29 is a flow chart of an air supply process for supplying air when turning a wafer on the bonding stage according to yet another preferred embodiment of the present invention.
Figure 30:
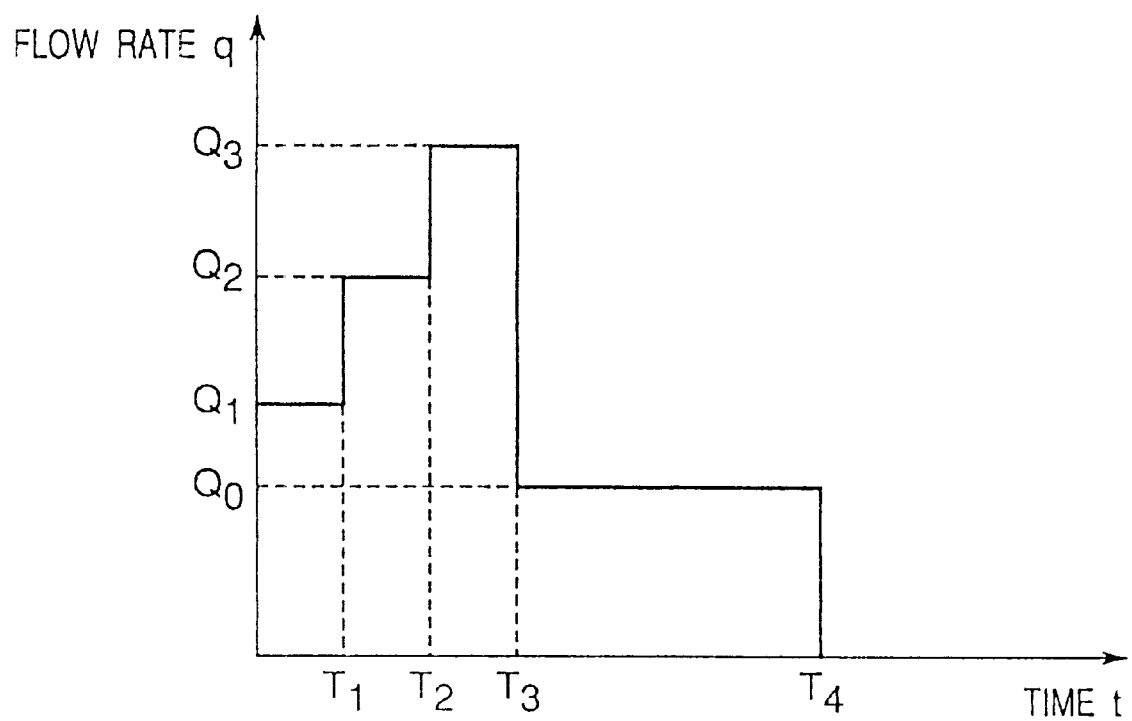
FIG. 30 is a graph showing the change in air flow in the air supply process shown in FIG. 29.

A further alternative method of controlling the air supply for wafer turn according to the present invention is described next with reference to FIG. 29 and FIG. 30. FIG. 29 is a flow chart of this air supply method, and FIG. 30 is a graph showing the change in air flow achieved by this method. The configuration of the turn air blower used in this air supply method is identical to that used in the above process and shown in FIG. 24. Further description thereof is thus omitted below.

To start wafer turn, the control valves 124 and 127 of both air supply means 122 and 125 are opened to supply both the primary and auxiliary air streams to the air outlets 102 with a total air flow $Q_1$ (see FIG. 30) released from the air outlets 102 on the top surface of the bonding stage 10 (step #71).

At time $t=T_1$, the air flow controlled by needle 126 is then changed to increase the auxiliary air supply (step #72). The combined air flow from the air outlets 102 at this time is $Q_2$, where $Q_2>Q_1$.

At time $t=T_2$, the air flow controlled by needle 126 is again changed to again increase the auxiliary air supply (step #73). The combined air flow from the air outlets 102 at this time is $Q_3$, where $Q_3>Q_2$.

At time $t=T_3$, the flow control valve 127 of the auxiliary supply means 125 is closed to turn the auxiliary air stream off (step #74). Air flow from the air outlets 102 is thus reduced to a level $Q_0$ sufficient only to maintain wafer turn. This air flow is maintained to time $t=T_4$, at which point the flow control valve 124 for the air supply means 122 is closed to stop supplying air to the turn air outlets 102 (step #75). The wafer 1 thus gradually loses speed and stops on the bonding stage 10.

By thus gradually increasing the air supply from the auxiliary supply means in this alternative embodiment of the present invention to gradually increase the total air flow, wafer turn can be started gradually and the wafer can thus be prevented from accidentally slipping off the bonding stage.

It is to be noted that while the turn air outlets are disposed around a single circular path near the periphery of the wafer on the bonding stage 10 as a preferred means of achieving stable wafer turn, it is further possible to provide additional turn air outlets inside this outside circumference. A bonding stage according to this alternative embodiment of the invention is shown in FIG. 31.

Figure 31:
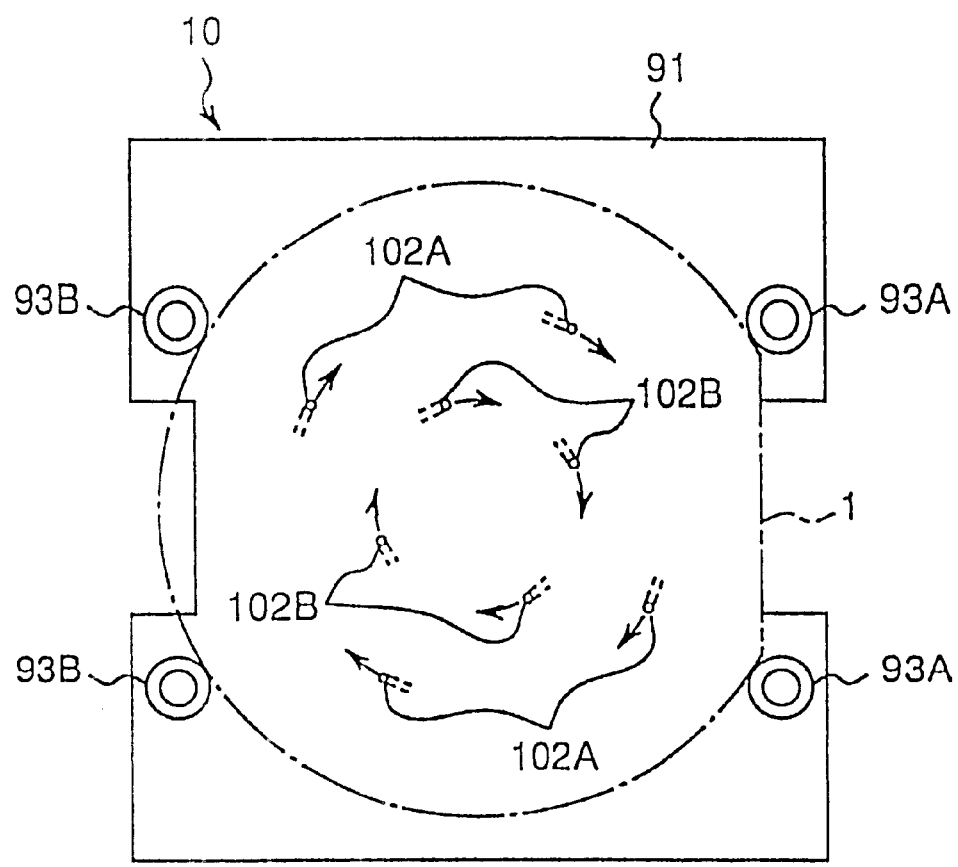
FIG. 31 is a descriptive view of an air outlet for wafer turn in a bonding stage according to an alternative preferred embodiment of the present invention.

As will be known from FIG. 31, a stage plate 91 in a bonding stage 10 according to this preferred embodiment comprises outside turn air outlets 102A disposed in an area near the wafer edge, and inside turn air outlets 102B disposed inside of these outside outlets. Air is supplied to these air outlets from an air supply means substantially identical to that described above so that air is ejected evenly from both the outside and inside turn air outlets 102A and 102B. Note that the positioning roller pairs 93A and 93B are also shown for reference in FIG. 31.

By thus positioning air against the back of the wafer 1 from a wider area of the stage plate 91, turn force causing the wafer to turn can be distributed to the entire back surface of the wafer 1 to achieve stable wafer turn. This method is particularly effective with large wafers.

It is also to be noted that while the above exemplary embodiment of the invention has been described with the blower 120 shown in FIG. 24 blowing air from the air supply means 122 and auxiliary supply means 125 from the same air outlets 102, the invention shall obviously not be so limited. More specifically, separate air outlets can be provided for the air supply means 122 and the auxiliary supply means 125. For example, air supplied from the turn air supply means 122 can be ejected from inside turn air outlets 102B, while air supplied from the auxiliary supply means 125 can be ejected from outside turn air outlets 102A. In this case a relatively weak supply of air can be used for the auxiliary supply.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A bump bonding apparatus comprising:

a bonding head being operable to form bumps on a wafer having an orientation flat on a circumferential edge thereof before the wafer is diced into a plurality of individual IC chips;

a bonding stage being operable to support and position the wafer such that said bonding head is operable to form bumps on the wafer, said bonding stage including a floating and turning component being operable to float and turn the wafer on a top surface of said bonding stage; and a transporting device being operable to transport the wafer to said bonding stage and place the wafer on said bonding stage in a prearranged orientation, said transporting device including a chucking component operable to hold the wafer, said chucking component comprising a first outside-finger and a second outside-finger arranged in parallel, each of said first and second outside-fingers having a pair of chucking pins positioned at a specific distance along a longitudinal direction of said first and second outside-fingers, respectively, and extended vertically downward, and said first and second outside-fingers being adapted to be driven such that said pairs of chucking pins on said first and second outside-fingers are moveable in a direction towards and away from each other, each chucking pin of said pairs of chucking pins including a flange disposed at a bottom end thereof to prevent the wafer from dropping out, and a middle-finger positioned between said first and second outside-fingers in parallel with each of said first and second outside-fingers, said middle-finger having a pair of chucking pins adapted to be moveable in a direction towards and away from each other in a longitudinal direction of said middle-finger orthogonal to the moving direction of said pairs of chucking pins of said first and second outside-fingers, each of said pair of chucking pins of said middle-finger including a flange disposed at a bottom end thereof to prevent the wafer from dropping out.

2. The apparatus of claim 1, wherein said transporting device further includes an orientation flat detection component being operable to detect a position of the orientation flat of the wafer supported by said bonding stage.

* * * * *

UNITED STATES PATENT AND TRADEMARK OFFICE
CERTIFICATE OF CORRECTION

PATENT NO.    : 6,568,580 B2
DATED         : May 27, 2003
INVENTOR(S)   : Shoriki Narita et al.

It is certified that error appears in the above-identified patent and that said Letters Patent is hereby corrected as shown below:

<u>Title page,</u>
Item [56], References Cited, U.S. PATENT DOCUMENTS, change
"5,550,540 A 8/1996 Furlan et al. …………27/82" to -- 5,500,540 A 3/1996 Jewell et al. …………27/82 --.

Signed and Sealed this

Twenty-fifth Day of November, 2003

JAMES E. ROGAN
*Director of the United States Patent and Trademark Office*